(12) United States Patent
Lee et al.

(10) Patent No.: US 12,107,074 B2
(45) Date of Patent: *Oct. 1, 2024

(54) SEMICONDUCTOR PACKAGE INCLUDING PROCESSING ELEMENT AND I/O ELEMENT

(71) Applicant: Advanced Semiconductor Engineering, Inc., Kaohsiung (TW)

(72) Inventors: Chang Chi Lee, Kaohsiung (TW); Jung Jui Kang, Kaohsiung (TW); Chiu-Wen Lee, Kaohsiung (TW); Li Chieh Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/115,743

(22) Filed: Feb. 28, 2023

(65) Prior Publication Data

US 2023/0207524 A1    Jun. 29, 2023

Related U.S. Application Data

(63) Continuation of application No. 17/338,600, filed on Jun. 3, 2021, now Pat. No. 11,594,518.

(51) Int. Cl.
*H01L 25/065* (2023.01)
*H01L 23/538* (2006.01)

(52) U.S. Cl.
CPC ...... *H01L 25/0655* (2013.01); *H01L 23/5385* (2013.01); *H01L 23/5386* (2013.01); *H01L 23/5387* (2013.01)

(58) Field of Classification Search
CPC ............. H01L 25/0655; H01L 23/5385; H01L 23/5386
USPC ........................................................ 257/773
See application file for complete search history.

(56) References Cited

U.S. PATENT DOCUMENTS

| | | | |
|---|---|---|---|
| 11,594,518 B2 * | 2/2023 | Lee | H01L 25/18 |
| 2013/0043600 A1 | 2/2013 | Sadaka | |
| 2014/0332966 A1 * | 11/2014 | Xiu | H01L 23/293 257/773 |
| 2015/0091177 A1 | 4/2015 | Hong et al. | |

OTHER PUBLICATIONS

Non-Final Office Action for U.S. Appl. No. 17/338,600, issued Jul. 19, 2022, 10 pages.
Notice of Allowance for U.S. Appl. No. 17/338,600, issued, Nov. 2, 2022, 7 pages.

* cited by examiner

*Primary Examiner* — Quoc D Hoang
(74) *Attorney, Agent, or Firm* — FOLEY & LARDNER LLP

(57) ABSTRACT

A semiconductor package and a method for manufacturing a semiconductor package are provided. The semiconductor package includes a first processing element, a first I/O element, a second processing element, and a second I/O element. The first processing element is on a substrate. The first I/O element is on the substrate and electrically connected to the first processing element. The second processing element is on the substrate. The second I/O element is on the substrate and electrically connected to the second processing element. The first I/O element is electrically connected to and physically separated from the second I/O element.

16 Claims, 22 Drawing Sheets

SEMICONDUCTOR PACKAGE INCLUDING PROCESSING ELEMENT AND I/O ELEMENT

CROSS-REFERENCE TO RELATED APPLICATION

This application is a continuation of U.S. patent application Ser. No. 17/338,600 filed Jun. 3, 2021, now issued as U.S. Pat. No. 11,594,518, the contents of which is incorporated herein by reference in its entirety.

BACKGROUND

1. Technical Field

The present disclosure relates generally to a semiconductor package and a method for manufacturing the same, particularly to a semiconductor package including an electrically conductive element electrically connecting between two packages.

2. Description of the Related Art

While the numbers of transistors in processors (e.g., application-specific integrated circuits (ASICs)) in device packages have been increasing dramatically in recent years, the advance in the development of manufacturing processes of memories (e.g., high bandwidth memories (HBMs)) fail to keep up with that of processors to achieve a satisfactory operation speed.

SUMMARY

In one or more arrangements, a semiconductor package includes a first processing element, a first input/output (I/O) element, a second processing element, and a second I/O element. The first processing element is on a substrate. The first I/O element is on the substrate and electrically connected to the first processing element. The second processing element is on the substrate. The second I/O element is on the substrate and electrically connected to the second processing element. The first I/O element is electrically connected to and physically separated from the second I/O element.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

FIG. 1A-1 illustrates a schematic diagram showing the formation of the processing elements of a semiconductor package in accordance with some arrangements of the present disclosure.

FIG. 1A-2 illustrates a cross-sectional view of a transistor of a processing element of a semiconductor package in accordance with some arrangements of the present disclosure.

FIG. 1A-3 illustrates a top view of a transistor of a processing element of a semiconductor package in accordance with some arrangements of the present disclosure.

FIG. 1A-4 illustrates a perspective view of a transistor of a processing element of a semiconductor package in accordance with some other arrangements of the present disclosure.

FIG. 3B-1 illustrates a top view of a portion of a semiconductor package in accordance with some arrangements of the present disclosure.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
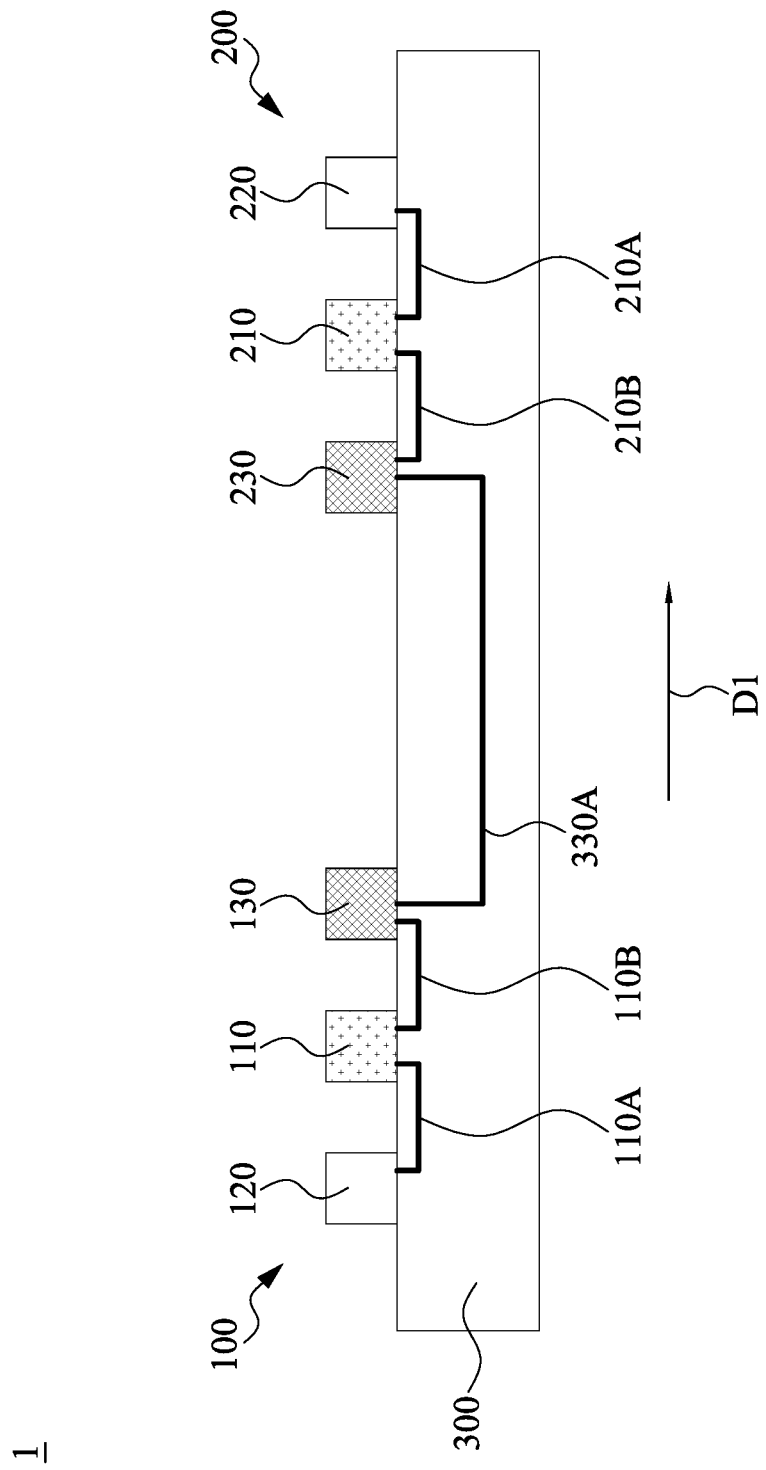
FIG. 1A illustrates a cross-sectional view of a semiconductor package in accordance with some arrangements of the present disclosure.

FIG. 1A illustrates a cross-sectional view of a semiconductor package 1 in accordance with some arrangements of the present disclosure. The semiconductor package 1 includes packages 100 and 200, a substrate 300, and an electrically conductive element 330A. In some arrangements, the semiconductor package 1 may be used in a computing system (e.g., a computer, a notebook, a tablet computer, a cell phone, a server, or the like).

The substrate 300 may include, for example, a printed circuit board, such as a paper-based copper foil laminate, a composite copper foil laminate, or a polymer-impregnated glass-fiber-based copper foil laminate. The substrate 300 may include an interconnection structure, which includes at least the electrically conductive elements 110A, 110B, 210A, 210B, and 330A. Each of the electrically conductive elements 110A, 110B, 210A, 210B, and 330A includes, for example, a plurality of conductive traces or a through via. In some arrangements, the substrate 300 includes at least one of a ceramic material, an organic substrate, or a metal plate. In some arrangements, the substrate 300 includes an interposer. In some arrangements, the substrate 300 may include a redistribution layer (RDL).

The package 100 and the package 200 are disposed the substrate 300. In some arrangements, the package 100 includes a processing element 110 (also referred to as "an electronic device configured to transmit high speed data"), a storage element 120 (also referred to as "an electronic device configured to store data"), and a connection element 130 (also referred to as "an input/output (I/O) element"). In some arrangements, the connection element 130 may be configured to transmit at least one of electrical signals or optoelectronic signals. In some arrangements, the processing element 110 is electrically connected to the storage element 120. In some arrangements, the processing element 110 is electrically connected to the storage element 120 through the electrically conductive element 110A. In some arrangements, the processing element 110 is electrically connected to the connection element 130. In some arrangements, the processing element 110 is electrically connected to the connection element 130 through the electrically conductive element 110B. In some other arrangements, a package may include merely one of the processing element 110, the storage element 120, and the connection element 130. In some other arrangements, the processing element 110 may be a packaged element, the storage element 120 may be a packaged element, and/or the connection element 130 may be a packaged element. In accordance with some arrangements of the present disclosure, a package 100 including the processing element 110, the storage element 120, and the connection element 130 are described hereinafter as examples, but the number of elements in one package may vary according to actual applications, and the present disclosure is not limited thereto.

The package 200 is separated from the package 100. As shown, the packages 100 and 200 are separated from one another with a physical gap therebetween. In some arrangements, the package 200 includes a processing element 210 (also referred to as "an electronic device configured to transmit high speed data"), a storage element 220 (also referred to as "an electronic device configured to store data"), and a connection element 230 (also referred to as "an I/O element"). In some arrangements, the connection element 230 may be configured to transmit at least one of electrical signals or optoelectronic signals. In some arrangements, the processing element 110 and the processing element 210 are configured to perform different functions. For example, one of the processing elements 110 and 210 may be configured to perform data processing, and the other one of the processing elements 110 and 210 may be configured to perform image processing. In some arrangements, the processing element 210 is electrically connected to the storage element 220. In some arrangements, the processing element 210 is electrically connected to the storage element 220 through the electrically conductive element 210A. In some arrangements, the processing element 210 is electrically connected to the connection element 230. In some arrangements, the processing element 210 is electrically connected to the connection element 230 through the electrically conductive element 210B. In some other arrangements, a package may include merely one of the processing element 210, the storage element 220, and the connection element 230. In some other arrangements, the processing element 210 may be a packaged element, the storage element 220 may be a packaged element, and/or the connection element 230 may be a packaged element. In accordance with some arrangements of the present disclosure, a package 200 including the processing element 210, the storage element 220, and the connection element 230 are described hereinafter as examples, but the number of elements in one package may vary according to actual applications, and the present disclosure is not limited thereto.

In some arrangements, the connection element 230 is physically separated from the connection element 130. In some arrangements, the package 100 is electrically connected to the package 200 through the electrically conductive element 330A. In some arrangements, the connection element 130 is disposed between the processing element 110 and the connection element 230. In some arrangements, the connection element 130 and the connection element 230 are disposed between the processing element 110 and the processing element 210.

Figures 1, 1A:
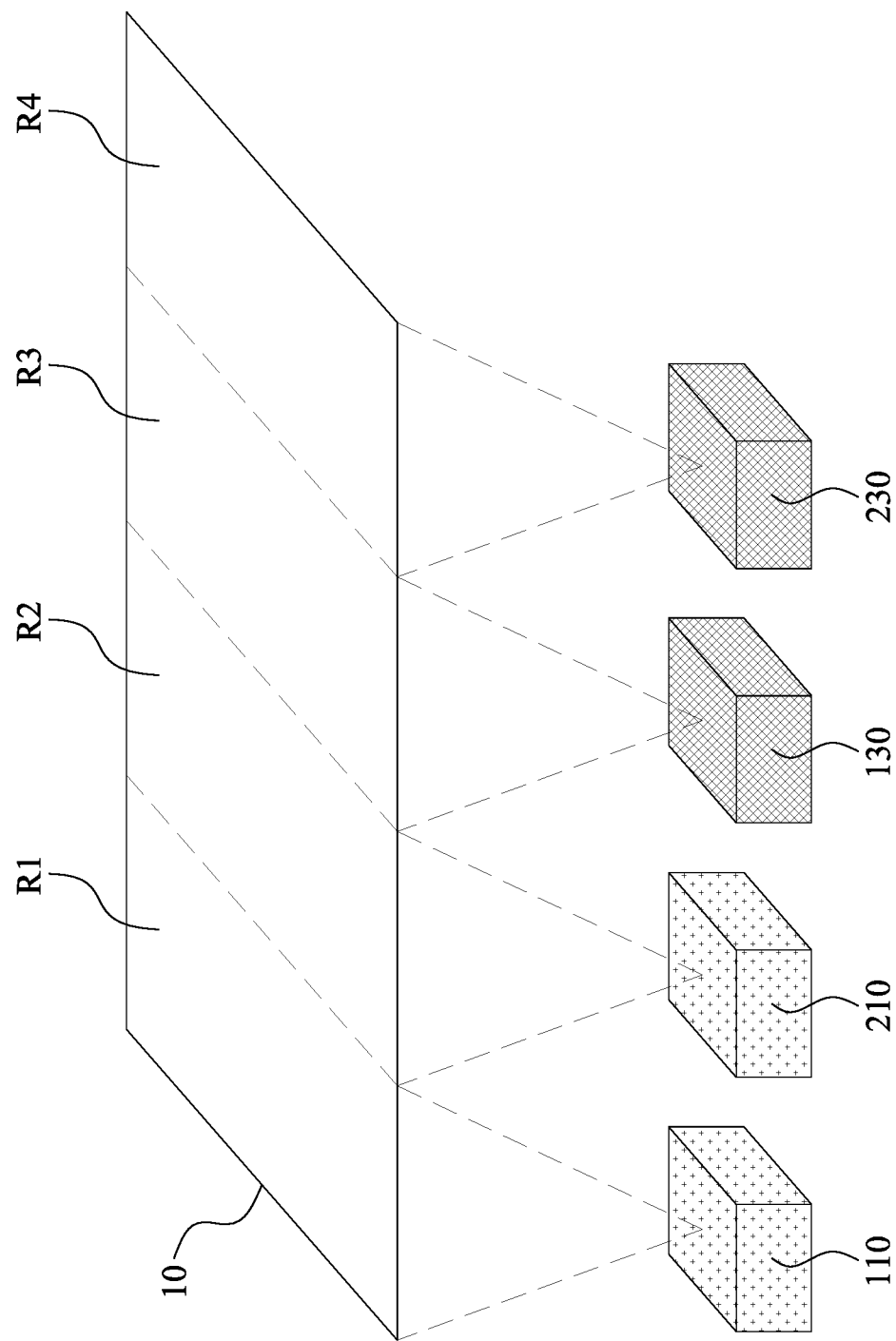

In some arrangements, as illustrated in FIG. 1A-1, which shows a schematic diagram of the formation of the processing elements 110 and 210 of the semiconductor package 1 in accordance with some arrangements of the present disclosure. In some arrangements, the processing elements 110 and 210 (also referred to as "processing chiplets") are formed by a same reticle 10. In further arrangements, the processing elements 110 and 210 (or the processing chiplets) and the connection elements 130 and 230 (also referred to as "connection chiplets") can be formed by the same reticle 10. In some arrangements, the processing element 110 is formed by a region R1 of the reticle 10, and the processing element 210 is formed by a region R2 of the reticle 10. In some arrangements, the connection element 130 is formed by a region R3 of the reticle 10, and the connection element 230 is formed by a region R4 of the reticle 10. Accordingly, in some examples, the processing elements 110 and 210 and the connection elements 130 and 230 are formed by continuous and adjacent regions (R1, R2, R3, and R4, respectively) of the same reticle 10. In some other arrangements, for a processer that includes a number of cores exceeding the manufacturing capacity of one reticle, the multiple cores of the processer may be formed by two or more different reticles, so as to form multiple processing units or chiplets (e.g., processing elements 110 and 210).

In some arrangements, each of the processing element 110 and the processing element 210 is divided from a monolithic processing unit (e.g., a central processing unit (CPU) which may be configured to perform data processing, a microcontroller unit (MCU), a graphics processing unit (GPU) which may be configured to perform image processing, an application-specific integrated circuit (ASIC), or the like). In some arrangements, each of the connection element 130 and the connection element 230 is divided from the monolithic processing unit. In some arrangements, the processing element 110 includes a CPU chiplet, a MCU chiplet, a GPU chiplet, an ASIC chiplet, or the like. The storage element 120 includes a memory device (e.g., a memory chiplet, such as a chiplet of a HBM). The connection element 130 includes an input/output (I/O) component (e.g., an I/O chiplet, such as a photonic I/O chiplet, an integrated photonic I/O chiplet, or the like). In some arrangements, the processing element 210 includes a CPU chiplet, a MCU chiplet, a GPU chiplet, an ASIC chiplet, or the like. The storage element 220 includes a memory device (e.g., a memory chiplet, such as a chiplet of a HBM). The connection element 230 includes an I/O component (e.g., an I/O chiplet). In some arrangements, the processing element 110 and the processing element 210 may be configured to perform the same processing functions or different processing functions. In some other arrangements, the connection element 130 may include an I/O chiplet including one or more transistors and conductive lines. In some other arrangements, the connection element 230 may include an I/O chiplet including one or more transistors and conductive lines.

In some arrangements, the monolithic processing unit may include a plurality of chiplets, such as the processing elements 110 and 210 and the connection elements 130 and 230. In some arrangements, the monolithic processing unit including the plurality of chiplets may be designed to provide a fully functionality of an independent semiconductor chip (e.g., an ASIC chip). In some arrangements, a portion of the chiplets from the monolithic processing unit is re-grouped to form the package 100, and another portion of the chiplets from the monolithic processing unit is re-grouped to form the package 200. In some arrangements, the chiplets in the packages 100 and 200 that are electrically connected through the electrically conductive element are packaged to form a fully functional semiconductor package 1.

In some arrangements, the electrically conductive element 330A is disposed (e.g., embedded) in the substrate 300. In some arrangements, the electrically conductive element 330A electrically connects the connection element 130 to the connection element 230. In some arrangements, the electrically conductive element 330A includes a redistribution layer. In some arrangements, the electrically conductive element 330A extends in the substrate 300 along or parallel to a direction D1 between the package 100 and the package 200.

In some arrangements, the processing element 110 and the processing element 210 have the same wafer node. In some arrangements, a wafer node of the processing element 110 or the processing element 210 is less than a wafer node of the storage element 120 and/or that of the storage element 220. In some arrangements, the processing element 110 includes a set of transistors, the storage element 120 includes a set of transistors. A gate length of each of the set of the transistors of the processing element 110 is less than a gate length of each of the set of transistors of the storage element 120. In some arrangements, a manufacturing process of the processing element 110 or the processing element 210 is more advanced than a manufacturing process of the storage element 120 or the storage element 220. In some arrangements, a wafer node of the processing element 110 or the processing element 210 is less than a wafer node of the connection element 130 or that of the connection element 230. In some arrangements, the connection element 130 includes a set of transistors, and a gate length of each of the set of the transistors of the processing element 110 is less than a gate length of each of the set of transistors of the connection element 130.

In some arrangements, a gate length of the processing element 110 is different from a gate length of the processing element 210. In some arrangements, one of the processing elements 110 and 210 includes a CPU, and the other one of the processing elements 110 and 210 includes a GPU. In some arrangements, the connection element 130 and the connection element 230 have different wafer nodes. In some arrangements, one of the connection elements 130 and 230 includes a MOSFET, and the other one of the connection elements 130 and 230 includes a FinFET. In some arrangements, a gate length of the connection element 130 is different from a gate length of the connection element 130.

Figures 1, 1A, 2, 3:
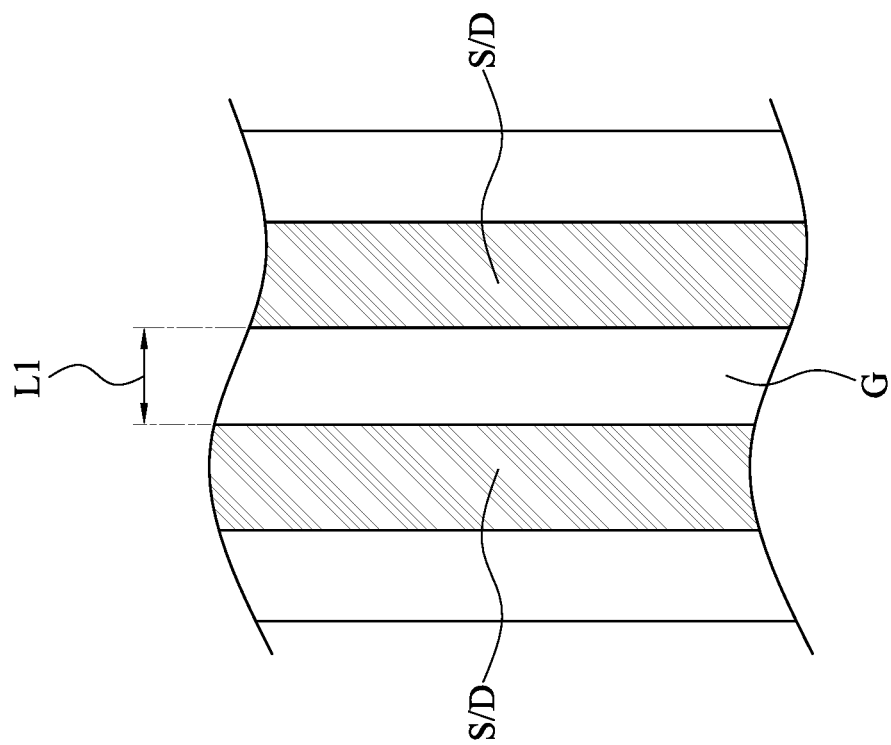
Figures 1, 1A, 2:
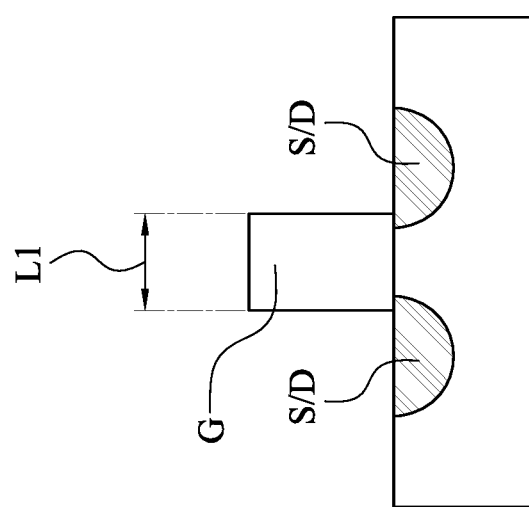
Figures 1, 1A, 2, 3, 4:
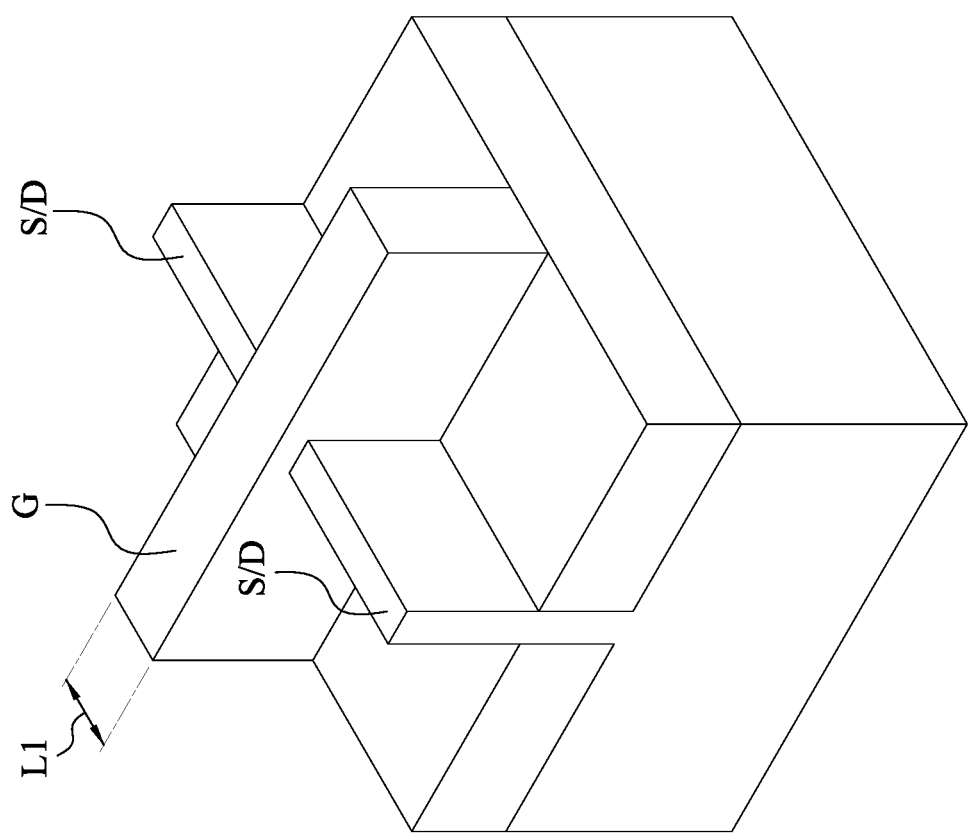

FIG. 1A-2 illustrates a cross-sectional view of a transistor of a processing element of a semiconductor package in accordance with some arrangements of the present disclosure, and FIG. 1A-3 illustrates a top view of a transistor of a processing element of a semiconductor package in accordance with some arrangements of the present disclosure. In some arrangements, the transistor shown in FIGS. 1A-2 and 1A-3 may be a MOSFET. FIG. 1A-4 illustrates a perspective view of a transistor of a processing element of a semiconductor package in accordance with some other arrangements of the present disclosure. In some arrangements, the transistor shown in FIG. 1A-4 may be a FinFET.

As used herein, the term "gate length" refers to or is defined by a length L1 of a gate G along a direction extending between two source/drain regions S/D. Nanometers (nm) may be the measurement units used to measure the gate length L1. As used herein, the term "wafer node" (or "technology node", "process node", "process technology node", or "node") refers to a parameter in a specific semiconductor manufacturing process and its design rules. For example, the wafer node used herein may be defined by a minimum gate width of a chip. A smaller wafer node corresponds to a smaller feature size, which in turn corresponds to smaller transistors.

In some arrangements, a manufacturing process of the processing element 110 or the processing element 210 is more advanced than a manufacturing process of the connection element 130 or the connection element 230. In some arrangements, the wafer node of the processing element 110 or the processing element 210 is about 10 nm. In some arrangements, the wafer node of the processing element 110 or the processing element 210 is about 7 nm. In some arrangements, the wafer node of the processing element 110 or that of the processing element 210 is about 3 nm. In some arrangements, the wafer node of the storage element 120 or that of the storage element 220 is about 10 nm. In some arrangements, the wafer node of the connection element 130 or that of the connection element 230 is about 14 nm. In some arrangements, the wafer node of the connection element 130 or that of the connection element 230 is about 28 nm. In some arrangements, the wafer node of a CPU is about 7 nm, and the wafer node of a GPU is about 10 nm. In some arrangements, the package 100 may include a CPU as the processing unit 110 and a connection element 130 having a relatively small wafer node of about 14 nm, and the package 200 may include a GPU as the processing unit 210 and a connection element 230 having a relatively large wafer node of about 28 nm. According to some arrangements of the present disclosure, with the processing units 110 and 210 including respective connection elements 130 and 230 that are physically separated from each other, the connection elements 130 and 230 may have different wafer nodes according to the wafer node of the respective processing unit which the connection elements 130 or 230 connects to. For example, a processing unit having a relatively large wafer node can be connected to a connection element having a relatively large wafer node. Therefore, the flexibility of the manufacturing process is increased, and the yield can be increased as well.

In some arrangements, a line/space (L/S) (or pitch) of conductive elements of the processing element 110 or the processing element 210 is less than a L/S of conductive elements of the storage element 120 or that of the storage element 220. In some arrangements, the L/S of conductive elements of the processing element 110 or the processing element 210 is less than an L/S of the connection element 130 or that of the connection element 230. In some arrangements, the L/S (or pitch) of the connection element 130 is different from the L/S (or pitch) of the connection element 230. L/S is defined as a minimum value of a line width and a line spacing of a circuit layer.

In some arrangements, features (e.g., conductive lines, conductive vias, and/or active components such as transistors) of the connection element 130 and features (e.g., conductive lines, conductive vias, and/or active components such as transistors) of the connection element 230 have different sizes. In some arrangements, features of the connection element 130 and features of the connection element 230 have different dimensions. In some arrangements, features of the connection element 130 and features of the connection element 230 have different heights. In some arrangements, features of the connection element 130 and features of the connection element 230 have different widths.

In some arrangements, a material of the connection element 130 and a material of the connection element 230 have different dielectric constants. In some arrangements, the material of the connection element 130 or 230 having a relatively small wafer node has a relatively low dielectric constant. In some arrangements, the material of the connection element 130 or 230 having a relatively small L/S (or pitch) has a relatively low dielectric constant. In some arrangements, a wafer node of the connection element 130 is less than a wafer node of the connection element 230, and a dielectric constant of a material of the connection element 130 is less than a dielectric constant of a material of the connection element 230. The relatively low dielectric constant of the material can reduce or prevent undesirable electrical coupling between conductive elements, especially for elements having a relatively small wafer node.

In some arrangements, the connection element 130 may include a mark on a peripheral region or an exterior portion (e.g., an external surface) of the connection element 130, the connection element 230 may include a mark on a peripheral region or an exterior portion (e.g., an external surface) of the connection element 230, and the mark of the connection element 130 is different from the mark of the connection element 230. In some arrangements, the mark of the connection element 130 and/or the connection element 230 may include a trade mark. In some arrangements, the mark of the connection element 130 and/or the connection element 230 may include a printed mark, an engraved mark, or a combination thereof.

Figure 1B:
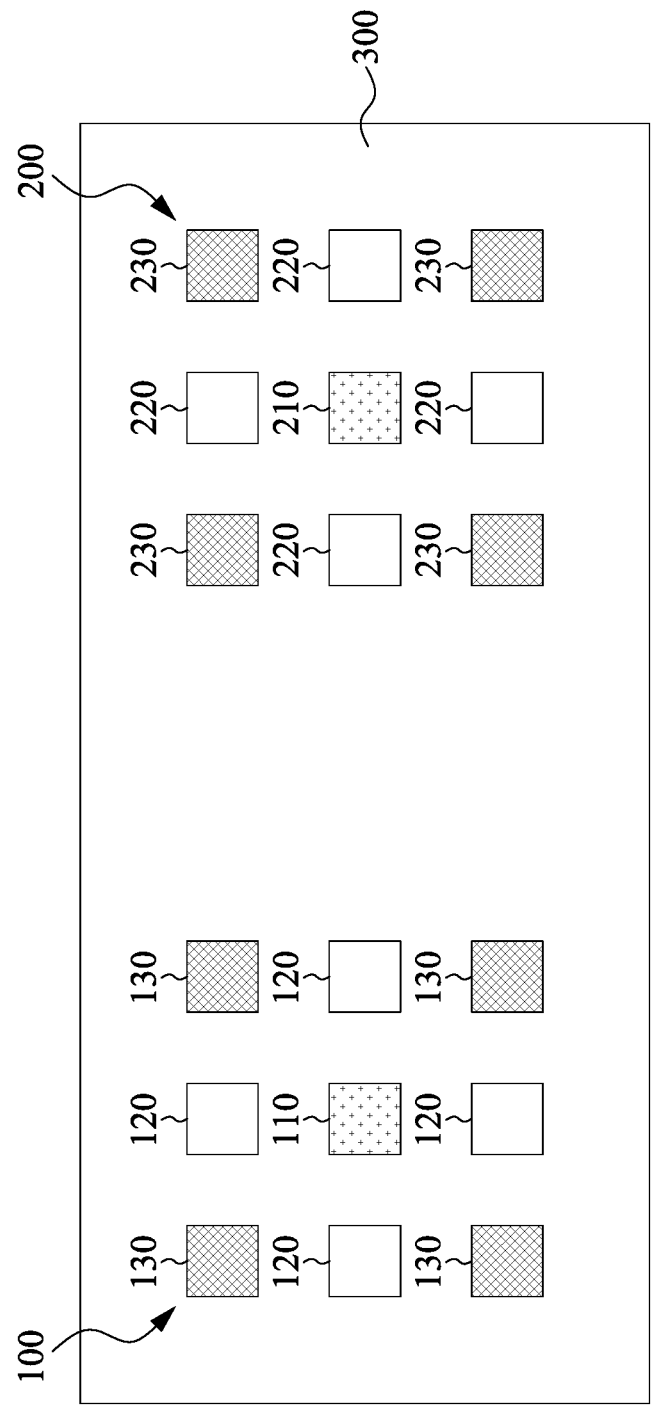
FIG. 1B illustrates a top view of a semiconductor package in accordance with some arrangements of the present disclosure.

FIG. 1B illustrates a top view of a semiconductor package 1 in accordance with some arrangements of the present disclosure. In some arrangements, FIG. 1B shows the arrangement of the processing elements 110 and 210, the storage elements 120 and 220, and the connection elements 130 and 230 shown in FIG. 1A. The electrically conductive element is omitted for clarity.

In some arrangements, the package 100 may include one processing element 110, four storage elements 120, and four connection elements 130. The package 200 may include one processing element 210, four storage elements 220, and four connection elements 230. In some arrangements, each connection element 130 is at an edge or a corner of the package 100. In some arrangements, the connection elements 130 are around at least two edges of the package 100. In some arrangements, the connection elements 130 are at a peripheral region of the processing element 110. In some arrangements, each connection element 230 is at an edge or a corner of the package 200. In some arrangements, the connection elements 230 are around at least two edges of the package 200. In some arrangements, the connection elements 230 are at a peripheral region of the processing element 210. In some arrangements, the processing element 110 is surrounded by the storage elements 120 and the connection elements 130, and the processing element 210 is surrounded by the storage elements 220 and the connection elements 230. The numbers and arrangements of the elements in the packages 100 and 200 may vary according to actual applications, and the present disclosure is not limited thereto.

In comparative embodiments, a computing system includes a monolithic processing unit and a plurality of memories disposed on a circuit board (e.g., a substrate or a motherboard). The plurality of memories communicate with each other through the circuit board. However, given that the manufacturing process of the monolithic processing unit is more advanced than that of the memories, the memories would not keep up with the data processing speed (or data rate) of the monolithic processing unit, which may reduce the data processing speed or data transmission speed of the entire computing system. In accordance with the arrangements as shown in FIG. 1A and FIG. 1B, a monolithic processing unit is divided into many chiplets (e.g., the processing elements 110 and 210), each surrounded by a plurality of memories (e.g., the storage elements 120 and 220). Therefore, as the total numbers of the memories communicated with the chiplets increase, the relative low data rate of each memory as mentioned above can be. This can increase the data processing speed or data transmission speed of the entire computing system (e.g., the semiconductor package 1).

In addition, conventionally, a monolithic processing unit includes I/O modules integrated therein. However, given that the pitch (or L/S) of the I/O modules is greater than that of the monolithic processing unit, said I/O module may occupy and waste many spaces within the monolithic processing unit. It is relatively difficult to reduce the overall size of the monolithic processing unit. In accordance with the arrangements as shown in FIG. 1A and FIG. 1B, given that the I/O modules (e.g., the connection elements 130 and 230) are divided from the monolithic processing unit, no space within each chiplet (e.g., the processing elements 110 and 210) is needed to accommodate the I/O modules, which can effectively increase the space usage of each chiplet. The overall size of the semiconductor package 1 can be reduced effectively, and the design flexibility of the functional chiplets (e.g., the arrangement of the processing elements, the storage elements, and the connection elements) can be also increased.

Moreover, conventionally, functional elements of a monolithic processing unit are formed by the same reticle. If one or more of the functional elements fail, the entire monolithic processing unit has to be reworked or even discarded, thus reducing the manufacturing yield. In accordance with the arrangements as shown in FIG. 1A and FIG. 1B, given that the chiplets (e.g., the processing elements 110 and 210) are formed by different regions of the same reticle, if the processing element 110 fails, there is no need to discard or rework the processing element 120 which is formed by a region different from the region that forms the processing element 110. Therefore, the manufacturing yield of the chiplets as well as the packages formed therefrom can be improved.

Figure 2A:
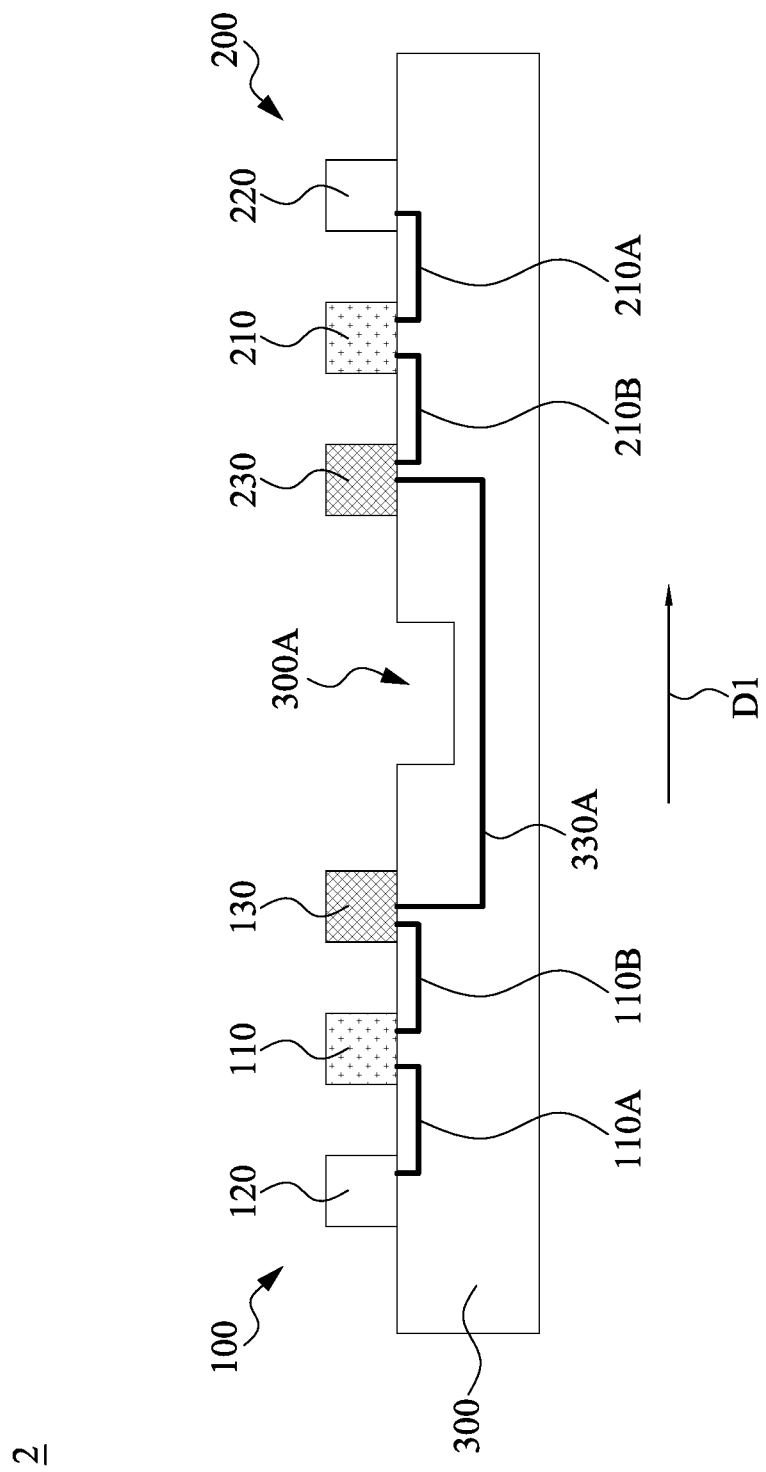
FIG. 2A illustrates a cross-sectional view of a semiconductor package in accordance with some arrangements of the present disclosure.

FIG. 2A illustrates a cross-sectional view of a semiconductor package 2 in accordance with some arrangements of the present disclosure. The semiconductor package 2 is similar to the semiconductor package 1 in FIG. 1A except that, for example, the substrate 300 includes a recess 300A.

In some arrangements, the recess 300A of the substrate 300 is between the package 100 and the package 200. In some arrangements, the electrically conductive element 330A extends under and across the recess 300A. According to some arrangements of the present disclosure, of the implementation of the recess 300A can reduce or prevent warpage of the substrate 300, which may be relatively large and prone to warpage.

Figure 2B:
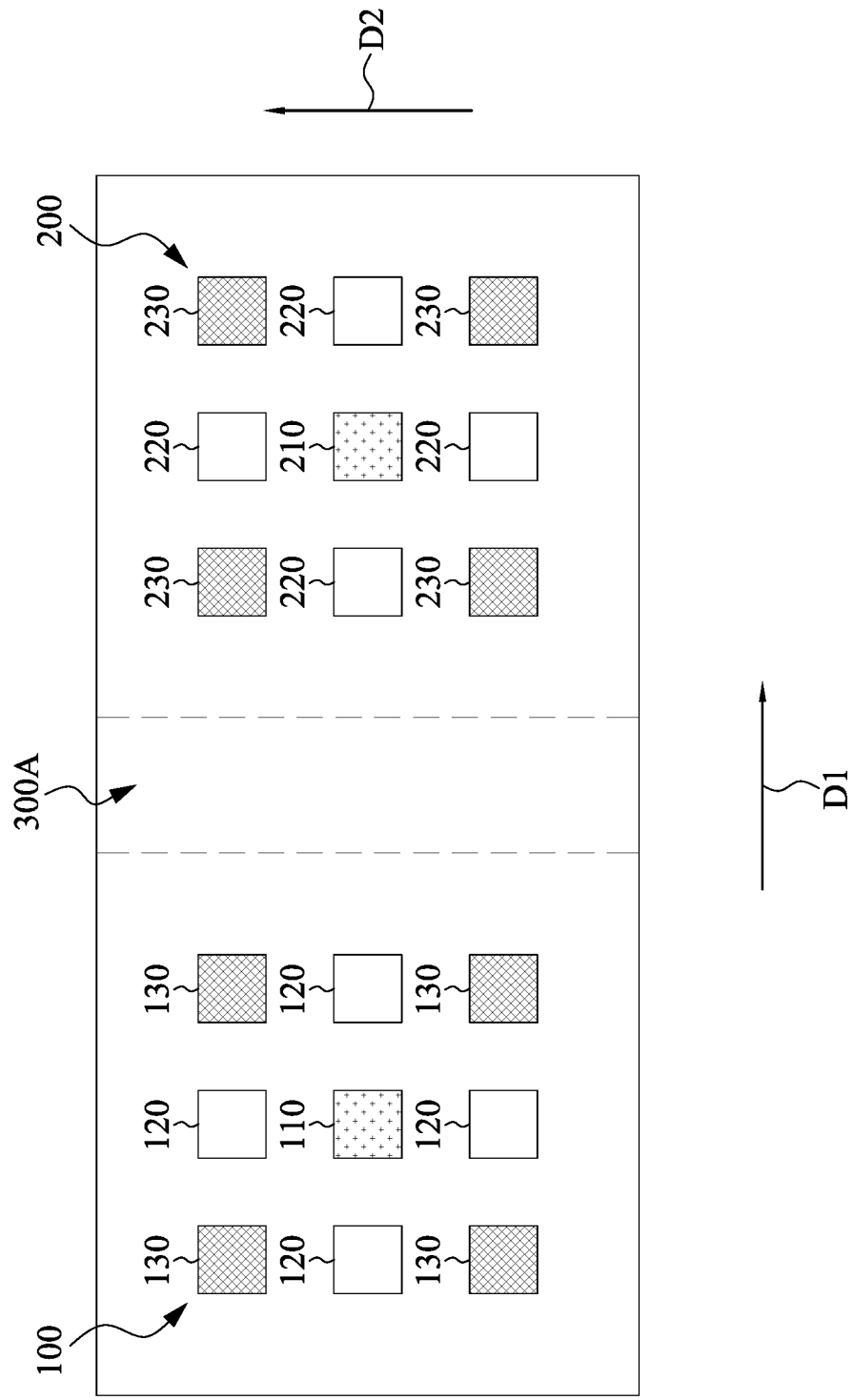
FIG. 2B illustrates a top view of a semiconductor package in accordance with some arrangements of the present disclosure.

FIG. 2B illustrates a top view of a semiconductor package 2 in accordance with some arrangements of the present disclosure. In some arrangements, FIG. 2B shows the arrangement of the processing elements 110 and 210, the storage elements 120 and 220, the connection elements 130 and 230, and the recess 300A shown in FIG. 2A, and the electrically conductive element is omitted for clarity.

In some arrangements, the recess 300A extends along or parallel to a direction D2, which is perpendicular to the direction D1 along or parallel to which the electrically conductive element extends. In some arrangements, the recess 300A extends between two opposite ends of the substrate 300, in a direction parallel to D2 and perpendicular to D1.

Figure 3A:
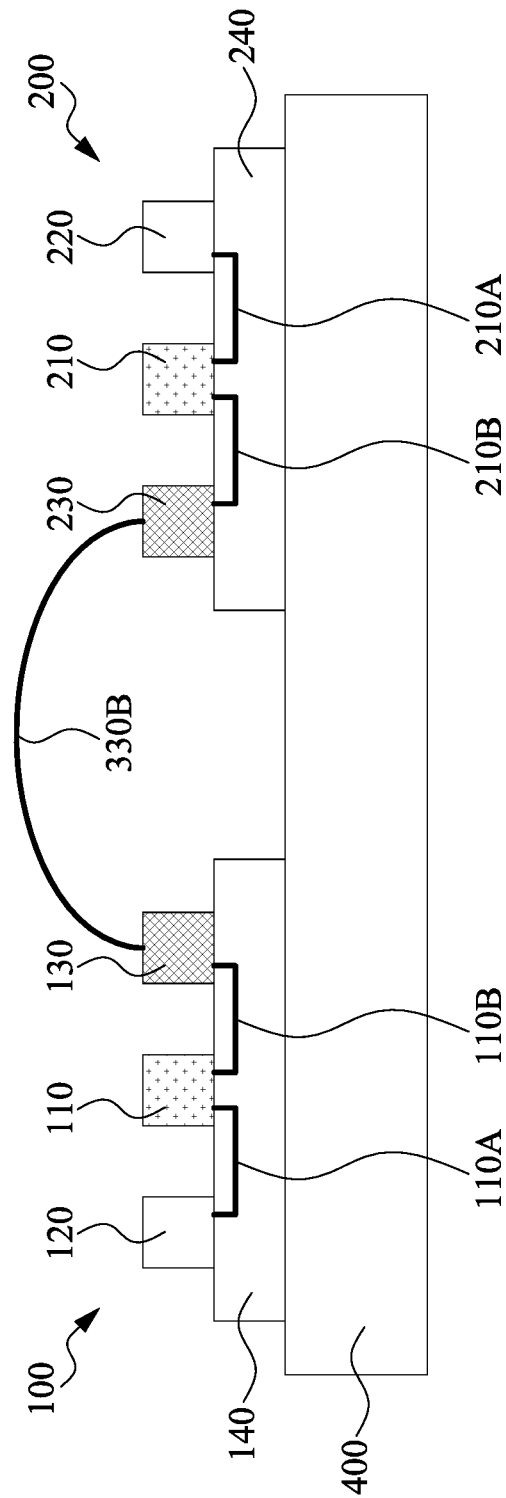
FIG. 3A illustrates a cross-sectional view of a semiconductor package in accordance with some arrangements of the present disclosure.

FIG. 3A illustrates a cross-sectional view of a semiconductor package 3 in accordance with some arrangements of the present disclosure. The semiconductor package 3 is similar to the semiconductor package 1 in FIG. 1A, and the differences are described as follows.

In some arrangements, the semiconductor package 3 further includes a base layer 400 and substrates 140 and 240. The base layer 400 may include, for example, a printed circuit board, such as a paper-based copper foil laminate, a composite copper foil laminate, or a polymer-impregnated glass-fiber-based copper foil laminate. The base layer 400 may include an interconnection structure, such as a plurality of conductive traces or a through via. In some arrangements, the base layer 400 includes a ceramic material, an organic substrate, or a metal plate.

In some arrangements, the substrates 140 and 240 are disposed on the base layer 400. In some arrangements, the substrate 140 is separated from the substrate 240. Each of the substrates 140 and 240 may include an interconnection structure, such as a plurality of conductive traces or a through via. Each of the substrates 140 and 240 may include an interposer. Each of the substrates 140 and 240 may include a redistribution layer.

In some arrangements, the package 100 is disposed on the substrate 140. The package 200 is disposed on the substrate 240. In some arrangements, the electrically conductive element 330B is outside from the substrate 140 and the substrate 240, as well as the base layer 400. In some examples, the electrically conductive element 330B does not contact the substrate 140, the substrate 240, and the base layer 400.

Figure 3B:
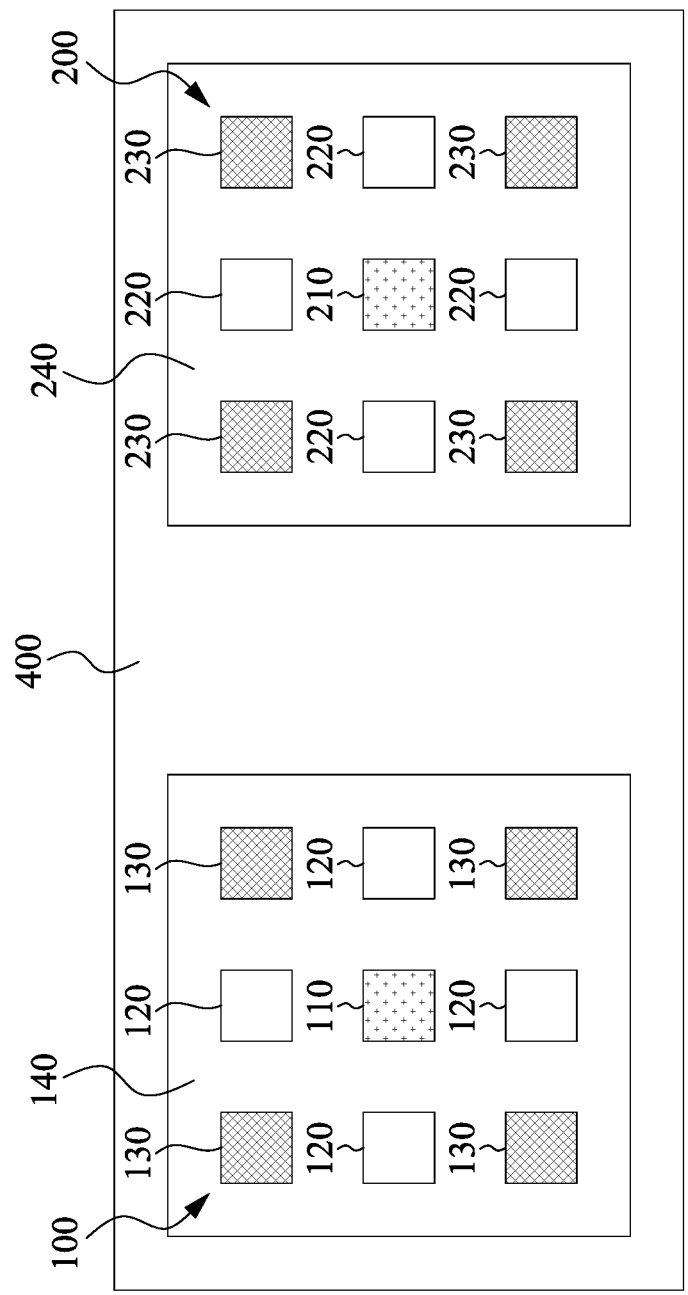
FIG. 3B illustrates a top view of a semiconductor package in accordance with some arrangements of the present disclosure.
Figures 1, 3B:
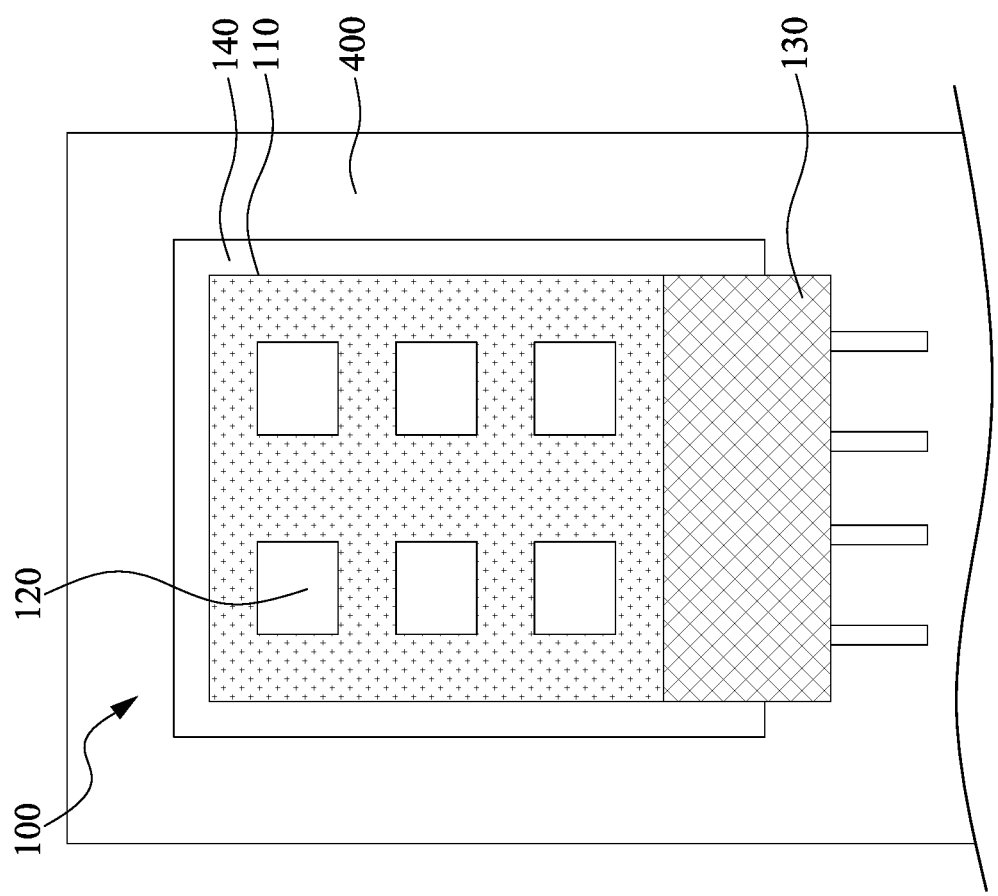

In some examples, the electrically conductive element 330B contacts an exterior surface of the substrate 140, the substrate 240, and the base layer 400. In some arrangements, the electrically conductive element 330B is disposed cover and across the substrate 140 and the substrate 240, as shown in FIG. 3B. In some arrangements, the electrically conductive element 330B includes a bonding wire.

According to some arrangements of the present disclosure, with the design of the packages 100 and 200 disposed on two separated substrates 140 and 240, respectively, if one or more of the elements of the package 100 fails, the package 100 can be discarded or reworked without discarding or reworking the package 200, vice versa. Therefore, the yield of the semiconductor package 3 can be improved.

FIG. 3B illustrates a top view of a semiconductor package 3 in accordance with some arrangements of the present disclosure. In some arrangements, FIG. 3B shows the arrangement of the processing elements 110 and 210, the storage elements 120 and 220, the connection elements 130 and 230, and the substrates 140 and 240 shown in FIG. 3A, and the electrically conductive element is omitted for clarity. In some arrangements, the substrate 140 is separated from the substrate 240 from a top view perspective. As shown, the substrate 140 and the substrate 240 are separated from one another with a physical gap therebetween.

FIG. 3B-1 illustrates a top view of a portion of a semiconductor package in accordance with some arrangements of the present disclosure. In some arrangements, FIG. 3B-1 shows a top view of the package 100 which may be included in a semiconductor package of the present disclosure. In some arrangements, the package 200 may include a structure similar to or the same as that of the package 100 illustrated in FIG. 3B-1.

In some arrangements, a plurality of storage elements 120 are stacked over the processing element 110 which is disposed on the substrate 140. In some arrangements, the storage elements 120 may be flip-chip bonded to the active surface of the processing element 110. In some arrangements, the processing element 110 may include conductive through vias within the processing element 110 and exposed from a backside surface facing the storage elements 120, and the storage elements 120 may be connected to the processing element 110 through the through silicon vias (TSVs).

In some arrangements, the connection element 130 may be disposed on the substrate 140 and arranged side-by-side with the processing element 110. In some arrangements, the connection element 130 may be connected to the processing element 110. In some arrangements, the connection element 130 may be a photonic I/O element or an integrated photonic I/O element including a converter and optical fibers connected to the converter.

Figure 4A:
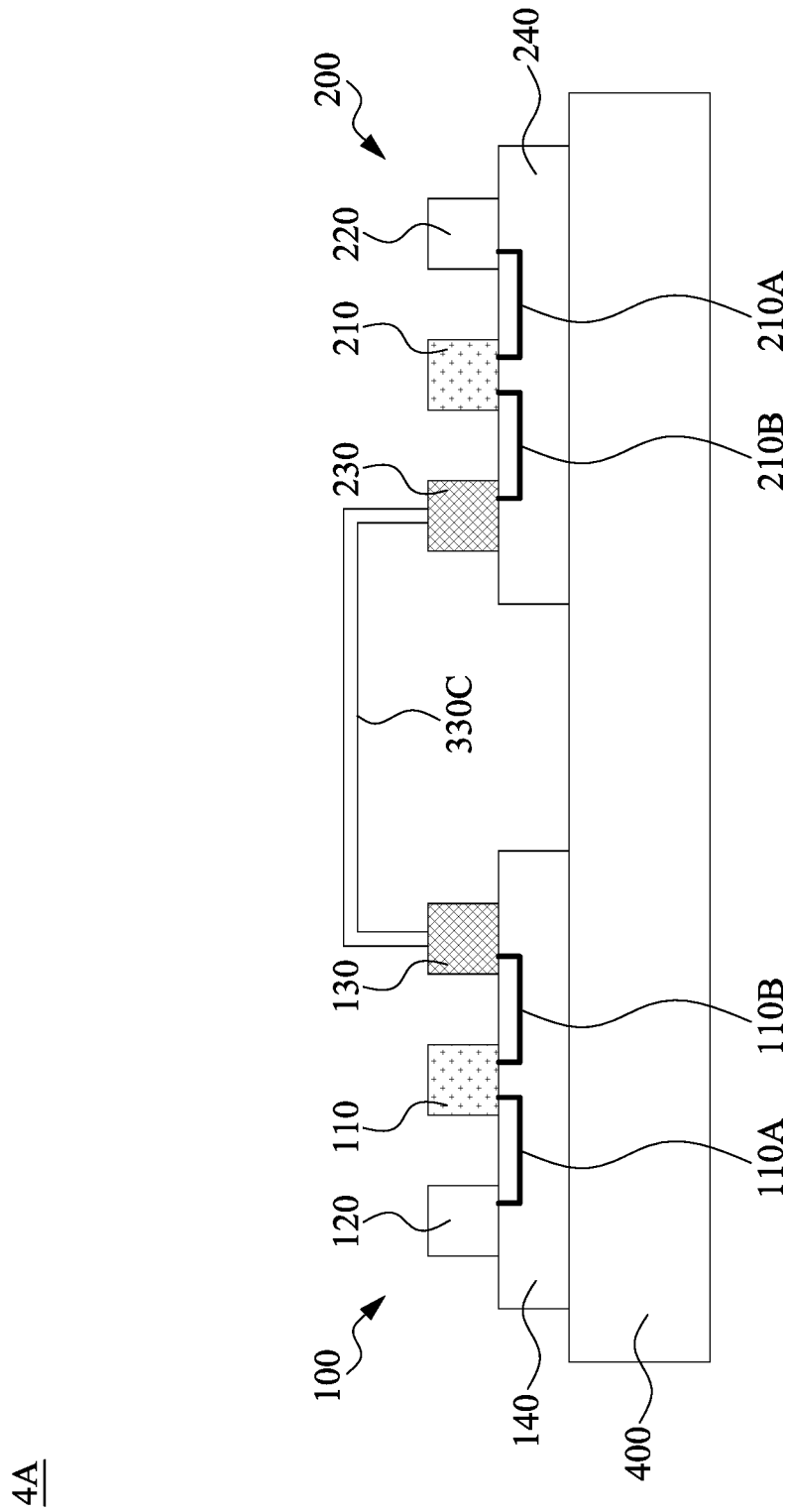
FIG. 4A illustrates a cross-sectional view of a semiconductor package in accordance with some arrangements of the present disclosure.

FIG. 4A illustrates a cross-sectional view of a semiconductor package 4A in accordance with some arrangements of the present disclosure. The semiconductor package 4A is similar to the semiconductor package 3 in FIG. 3A, and the differences are described as follows.

In some arrangements, the electrically conductive element 330C includes a flexible circuit board.

Figure 4B:
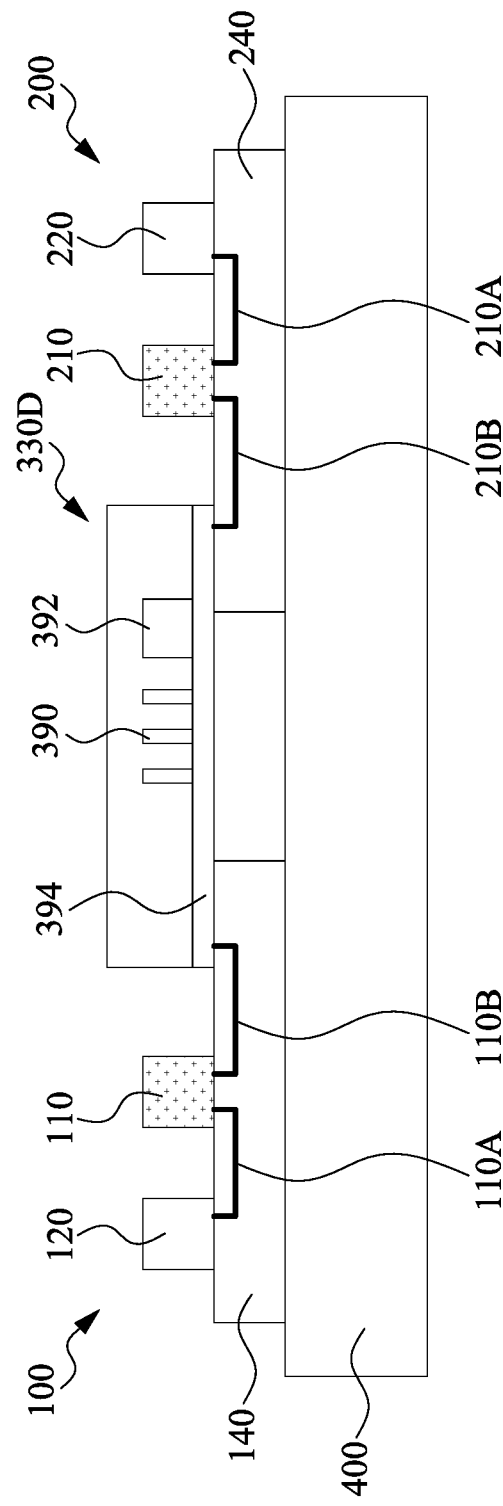
FIG. 4B illustrates a cross-sectional view of a semiconductor package in accordance with some arrangements of the present disclosure.

FIG. 4B illustrates a cross-sectional view of a semiconductor package 4B in accordance with some arrangements of the present disclosure. The semiconductor package 4B is similar to the semiconductor package 3 in FIG. 3A, and the differences are described as follows.

In some arrangements, the electrically conductive element includes a bridging element 330D. In some arrangements, the bridging element 330D electrically connects the processing element 110 to the processing element 210. In some arrangements, the bridging element 330D includes a bridge die. In some arrangements, the I/O elements or I/O modules for connecting to the processing elements 110 and 210 are integrated in the bridging element 330D.

In some arrangements, the bridging element 330D includes at least one capacitor 390 and an active component 392. While three capacitors 390 are shown in FIG. 4B, the bridging element 330D can include any number of capacitors 390. In some arrangements, the bridging element 330D further includes a redistribution layer 394 electrically connecting to the capacitor 390 and the active component 392. In some arrangements, the bridging element 330D electrically connects the connection element 130 to the connection element 230 through a pad of the connection element 130, the redistribution layer 394, and a pad of the connection element 230. In some arrangements, each capacitor 390 includes a deep trench capacitor. In some arrangements, each capacitor 390 may include a metal-dielectric laminate structure. The material of each capacitor 390 may include a dielectric (such as oxide) and/or a conductive material (such as polysilicon or metal). In some arrangements, the capacitor 390 may serve as a decoupling capacitor for filtering or reducing the noise from power supplies. In some arrangements, the active component 392 includes an amplifier, a modulator, or a combination thereof. In some arrangements, the active component 392 may serve to stabilize the power transmitting through the bridging element 330D, especially for long-distance transmission.

Figure 5A:
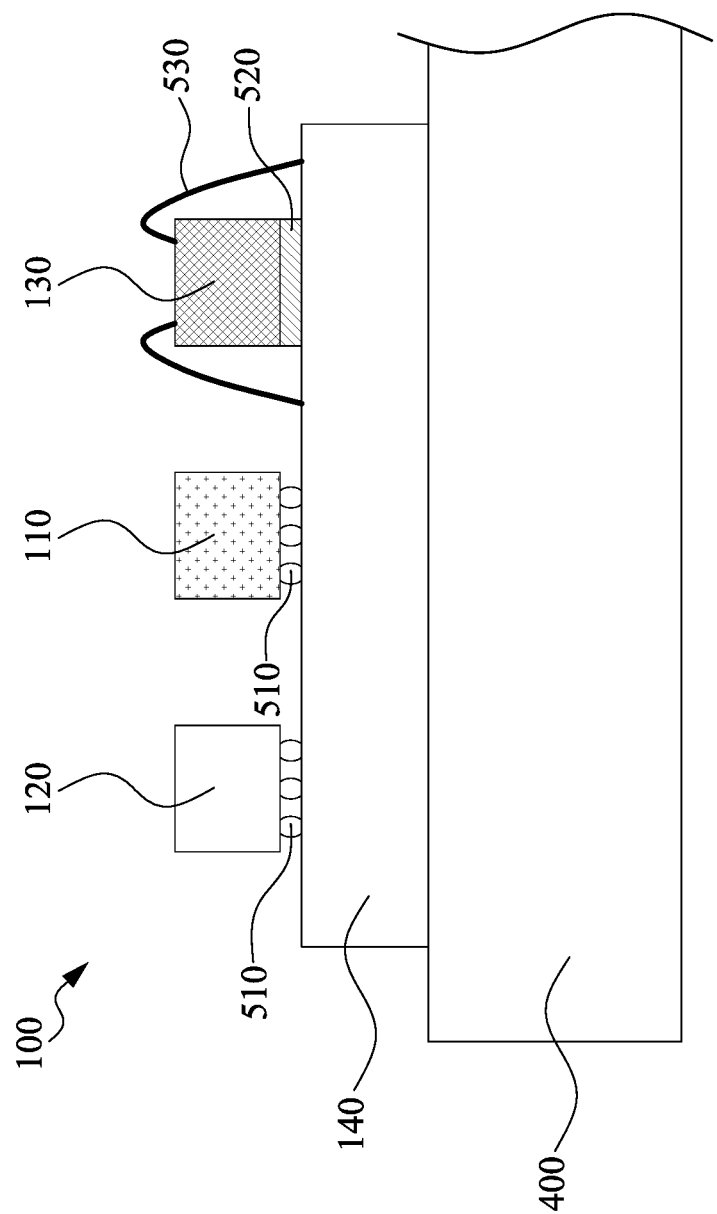
FIG. 5A illustrates a cross-sectional view of a portion of a semiconductor package in accordance with some arrangements of the present disclosure.

FIG. 5A illustrates a cross-sectional view of a portion of a semiconductor package in accordance with some arrangements of the present disclosure. In some arrangements, FIG. 5A shows a structure including the package 100.

In some arrangements, the processing element 110 is electrically connected to the substrate 140 through one or more conductive bumps 510. In some arrangements, the storage element 120 is electrically connected to the substrate 140 through one or more conductive bumps 510. In some arrangements, the connection element 130 is adhered to the substrate 140 through an adhesion layer 520 (e.g., a die attach film (DAF)). In some arrangements, a wafer node of the connection element 130 (or the I/O element) is relatively greater than that of the processing element 110 or that of the storage element 120. The connection element 130 may be electrically connected to the substrate 140 through a bonding wire 530. In some arrangements, the structure shown in FIG. 5A can be implemented in the package 200.

Figure 5B:
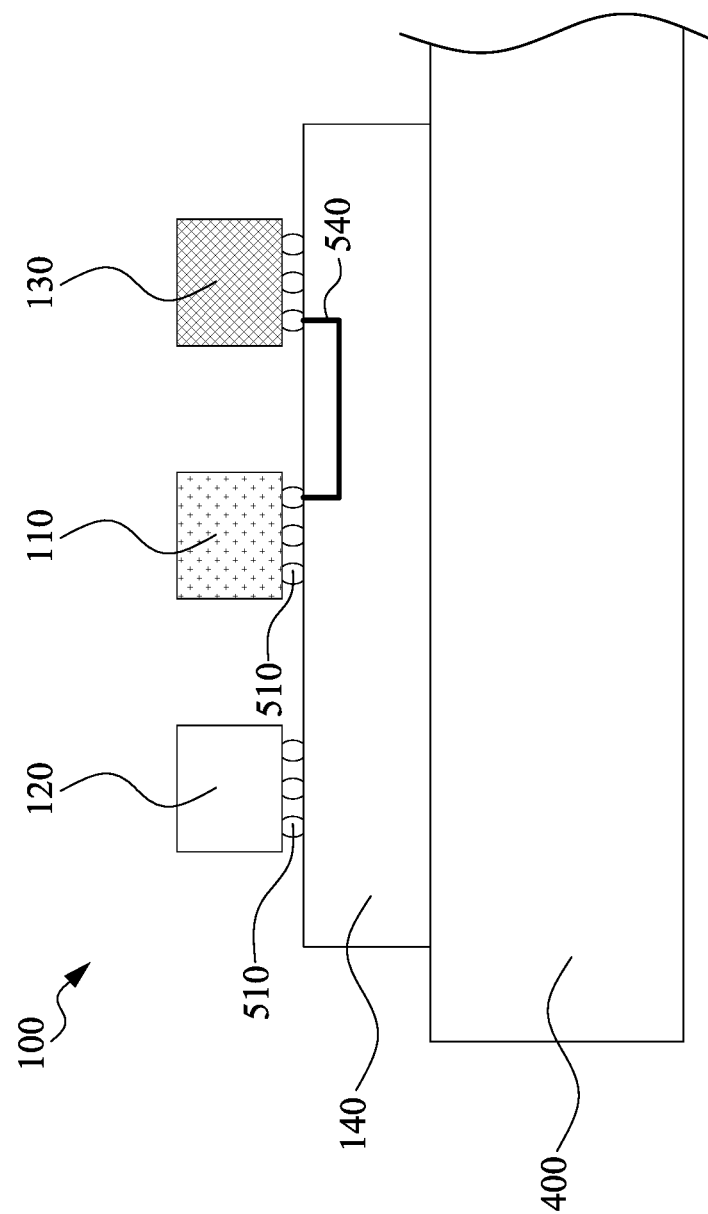
FIG. 5B illustrates a cross-sectional view of a portion of a semiconductor package in accordance with some arrangements of the present disclosure.

FIG. 5B illustrates a cross-sectional view of a portion of a semiconductor package in accordance with some arrangements of the present disclosure. In some arrangements, FIG. 5B shows a structure including the package 100.

In some arrangements, the processing element 110 is electrically connected to the substrate 140 through one or more conductive bumps 510. In some arrangements, the storage element 120 is electrically connected to the substrate 140 through one or more conductive bumps 510. In some arrangements, the connection element 130 is electrically connected to the substrate 140 through one or more conductive bumps 510. In some arrangements, the processing element 110 is electrically connected to the connection element 130 through a redistribution layer 540 within the substrate 140. As shown, the redistribution layer 540 is embedded within the substrate 140. In some arrangements, the structure shown in FIG. 5B can be implemented in the package 200.

Figure 5C:
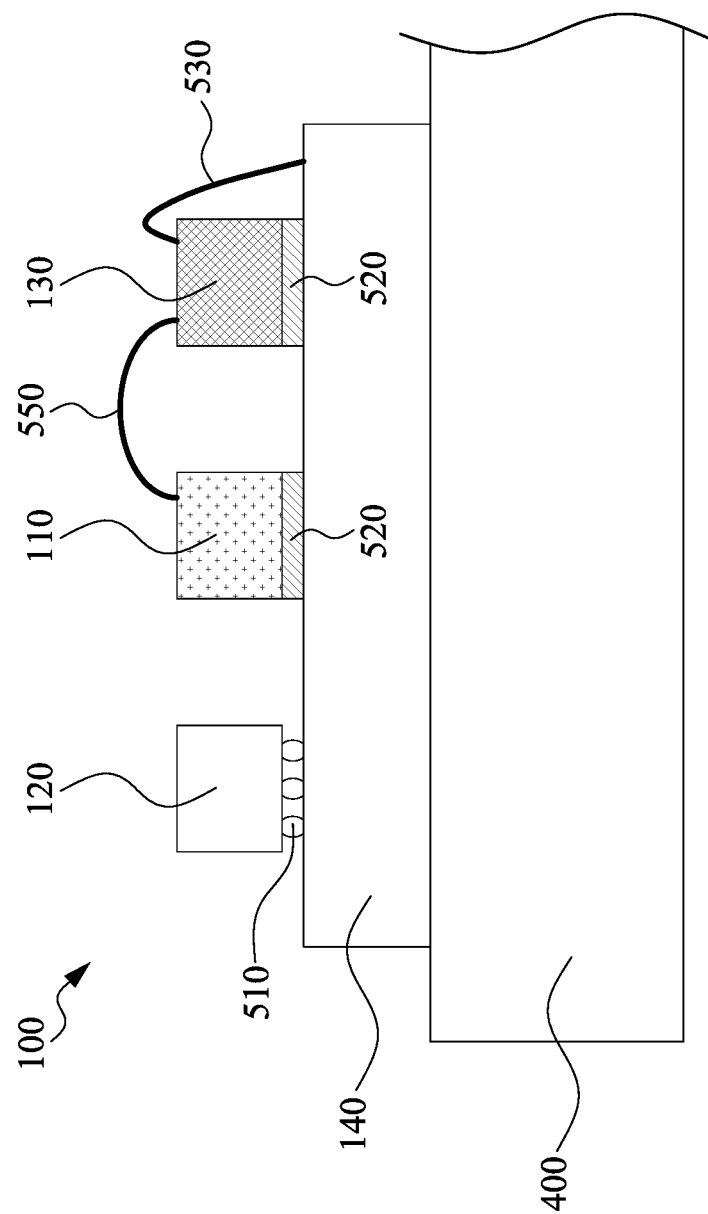
FIG. 5C illustrates a cross-sectional view of a portion of a semiconductor package in accordance with some arrangements of the present disclosure.

FIG. 5C illustrates a cross-sectional view of a portion of a semiconductor package in accordance with some arrangements of the present disclosure. In some arrangements, FIG. 5C shows a structure including the package 100.

In some arrangements, the storage element 120 is electrically connected to the substrate 140 through one or more conductive bumps 510. In some arrangements, the connection element 130 is adhered to the substrate 140 through an adhesion layer 520 (e.g., a DAF), and the connection element 130 is electrically connected to the substrate 140 through a bonding wire 530. In some arrangements, the processing element 110 is adhered to the substrate 140 through an adhesion layer 520 (e.g., a DAF), and the processing element 110 is electrically connected to the connection element 130 through a bonding wire 550. In some arrangements, the structure shown in FIG. 5C can be implemented in the package 200.

In some arrangements, the semiconductor packages 1, 2, 3, and 4A-4D can be implemented with any of the package structures shown in FIG. 5A through FIG. 5C, in place of, or in addition to, the package 100 and/or the package 200 illustrated in FIGS. 1, 2, 3, and 4A-4D.

Figure 6A:
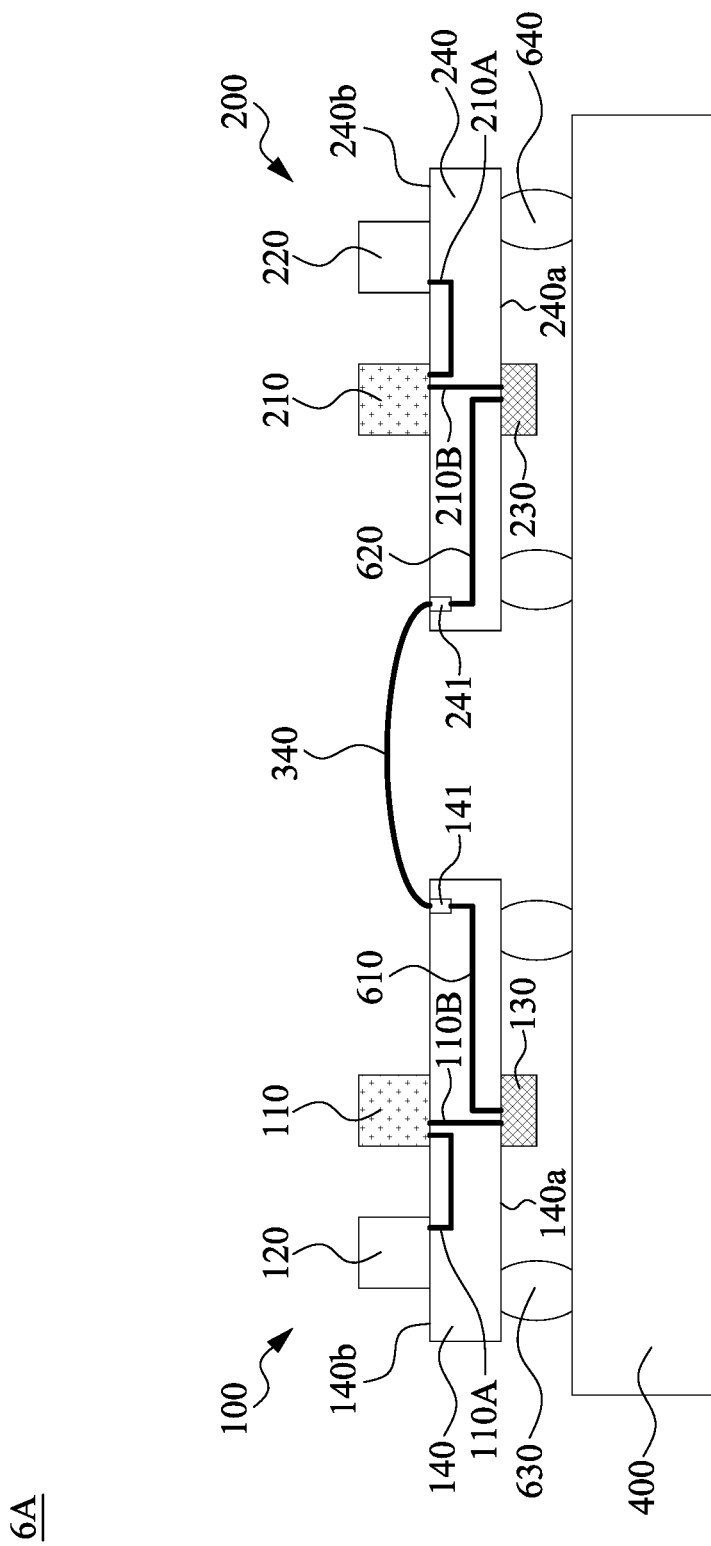
FIG. 6A illustrates a cross-sectional view of a semiconductor package in accordance with some arrangements of the present disclosure.

FIG. 6A illustrates a cross-sectional view of a semiconductor package 6A in accordance with some arrangements of the present disclosure. The semiconductor package 3 is similar to the semiconductor package 4D in FIG. 4D, and the differences are described as follows.

In some arrangements, the processing element 110 and the connection element 130 are electrically connected to two opposite sides (e.g., surfaces 140a and 140b) of the substrate 140. In some arrangements, the substrate 140 includes a redistribution layer 610 electrically connecting the connection element 130 to a pad 141 in proximity to, adjacent to, or embedded in and exposed at the surface 140b of the substrate 140. In some arrangements, the processing element 210 and the connection element 230 are electrically connected to two opposite sides (e.g., surfaces 240a and 240b) of the substrate 240. In some arrangements, the substrate 240 includes a redistribution layer 620 electrically connecting the connection element 230 to a pad 241 in proximity to, adjacent to, or embedded in and exposed at the surface 240b of the substrate 240. In some arrangements, the electrically conductive element 340 electrically connects the pad 141 of the substrate 140 to the pad 241 of the substrate 240.

In some arrangements, the substrate 140 is electrically connected to the base layer 400 through conductive structures 630. In some arrangements, the connection element 130 is electrically connected to the surface 140a of the substrate 140 facing the base layer 400. In some arrangements, the connection element 130 is electrically connected to the base layer 400 through the substrate 140 and the conductive structures 630. In some arrangements, the substrate 240 is electrically connected to the base layer 400 through conductive structures 640. In some arrangements, the connection element 230 is electrically connected to the surface 240a of the substrate 240 facing the base layer 400. In some arrangements, the connection element 230 is electrically connected to the base layer 400 through the substrate 240 and the conductive structures 640. In some arrangements, the conductive structures 630 and 640 may include solder balls, such as controlled collapse chip connection (C4) bumps, a ball grid array (BGA), or a land grid array (LGA).

Figure 6B:
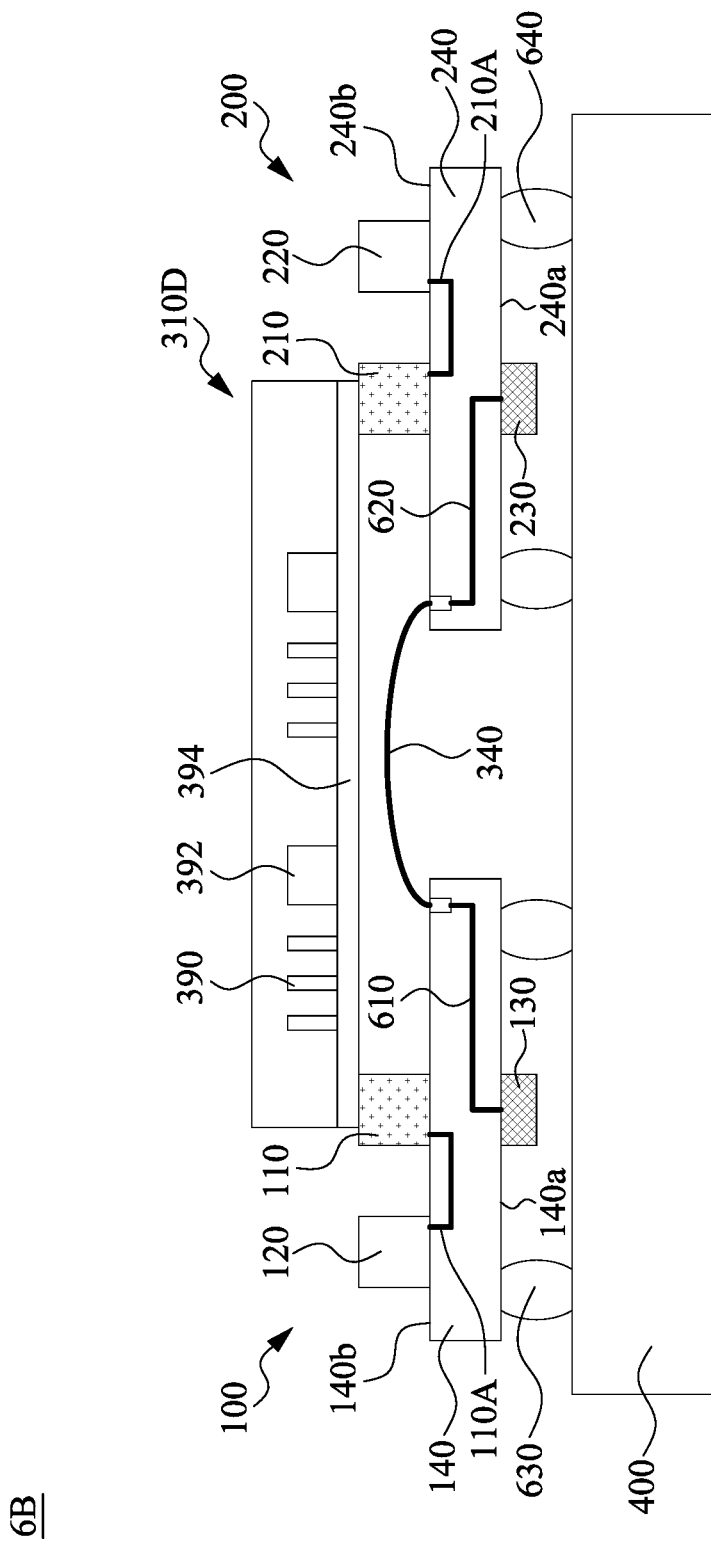
FIG. 6B illustrates a cross-sectional view of a semiconductor package in accordance with some arrangements of the present disclosure.

FIG. 6B illustrates a cross-sectional view of a semiconductor package 6B in accordance with some arrangements of the present disclosure. The semiconductor package 6B is similar to the semiconductor package 6A in FIG. 6A except that, for example, the semiconductor package 6B further includes the electrically conductive element 310D between the processing element 110 and the processing element 210. In some arrangements, the electrically conductive element 310D electrically connects the processing element 110 to the processing element 210. In some arrangements, the description of the electrically conductive element 310D is as aforementioned and omitted hereinafter.

Figure 7A:
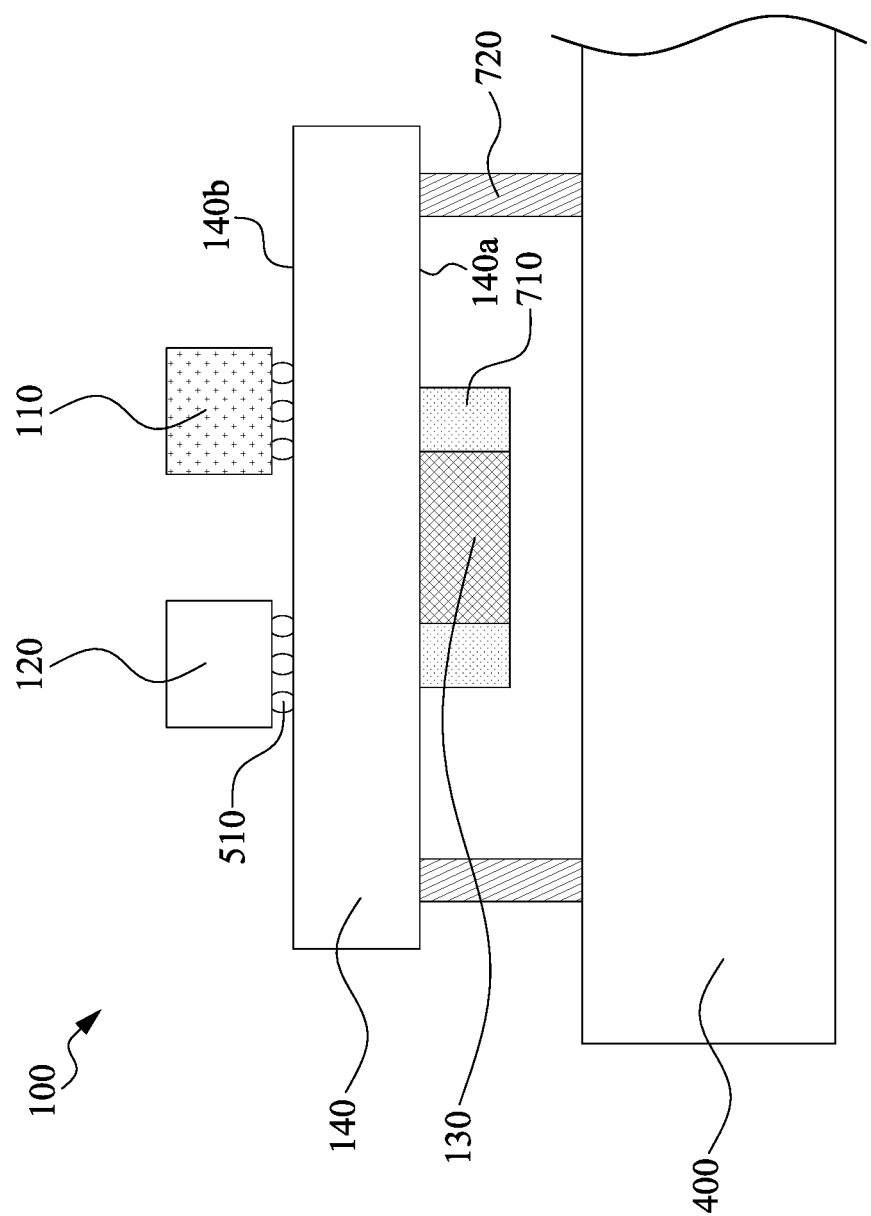
FIG. 7A illustrates a cross-sectional view of a portion of a semiconductor package in accordance with some arrangements of the present disclosure.

FIG. 7A illustrates a cross-sectional view of a portion of a semiconductor package in accordance with some arrangements of the present disclosure. In some arrangements, FIG. 7A shows a structure including the package 100.

In some arrangements, the package 100 further includes an encapsulant 710 and a conductive structure 720. In some arrangements, the encapsulant 710 encapsulates the connection element 130. In some arrangements, a portion (e.g., a surface facing the base layer 400) of the connection element 130 is exposed from the encapsulant 170 and separated from the base layer 400. In some arrangements, the substrate 140 is electrically connected to the base layer 400 through the conductive structure 720. In some arrangements, the connection element 130 is electrically connected to the base layer 400 through the substrate 140 and the conductive structure 720. In some arrangements, each conductive structure 720 includes a conductive pillar.

Figure 7B:
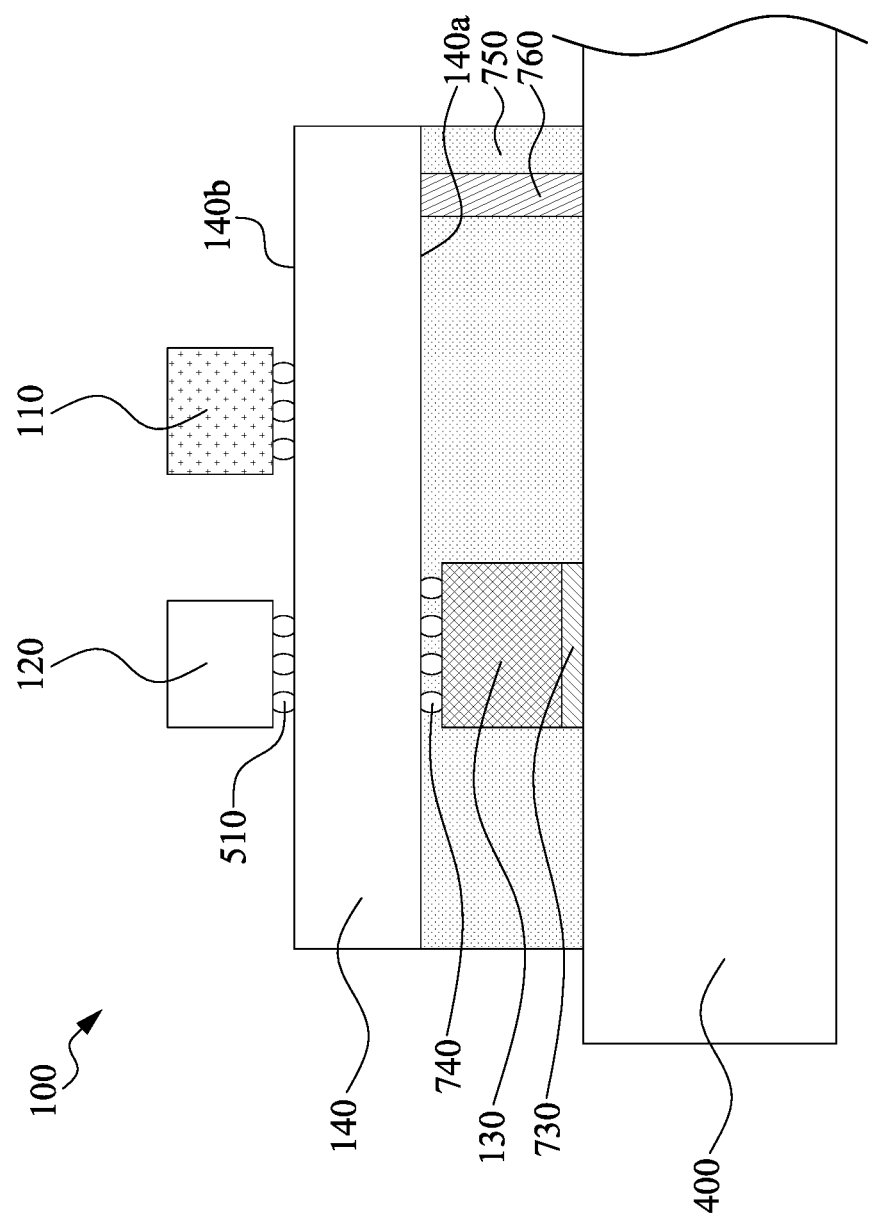
FIG. 7B illustrates a cross-sectional view of a portion of a semiconductor package in accordance with some arrangements of the present disclosure.

FIG. 7B illustrates a cross-sectional view of a portion of a semiconductor package in accordance with some arrangements of the present disclosure. In some arrangements, FIG. 7B shows a structure including the package 100.

In some arrangements, the package 100 further includes an adhesion layer 730, one or more conductive bumps 740, an encapsulant 750, and a conductive through via 760.

In some arrangements, the connection element 130 is adhered to the base layer 400 through the adhesion layer 730 (e.g., a DAF), and the connection element 130 is electrically connected to the substrate 140 through the conductive bumps 740. In some arrangements, the encapsulant 750 encapsulates the connection element 130. In some arrangements, the conductive through via 760 passes through the encapsulant 750 to electrically connect the substrate 140 to the base layer 400.

Figure 7C:
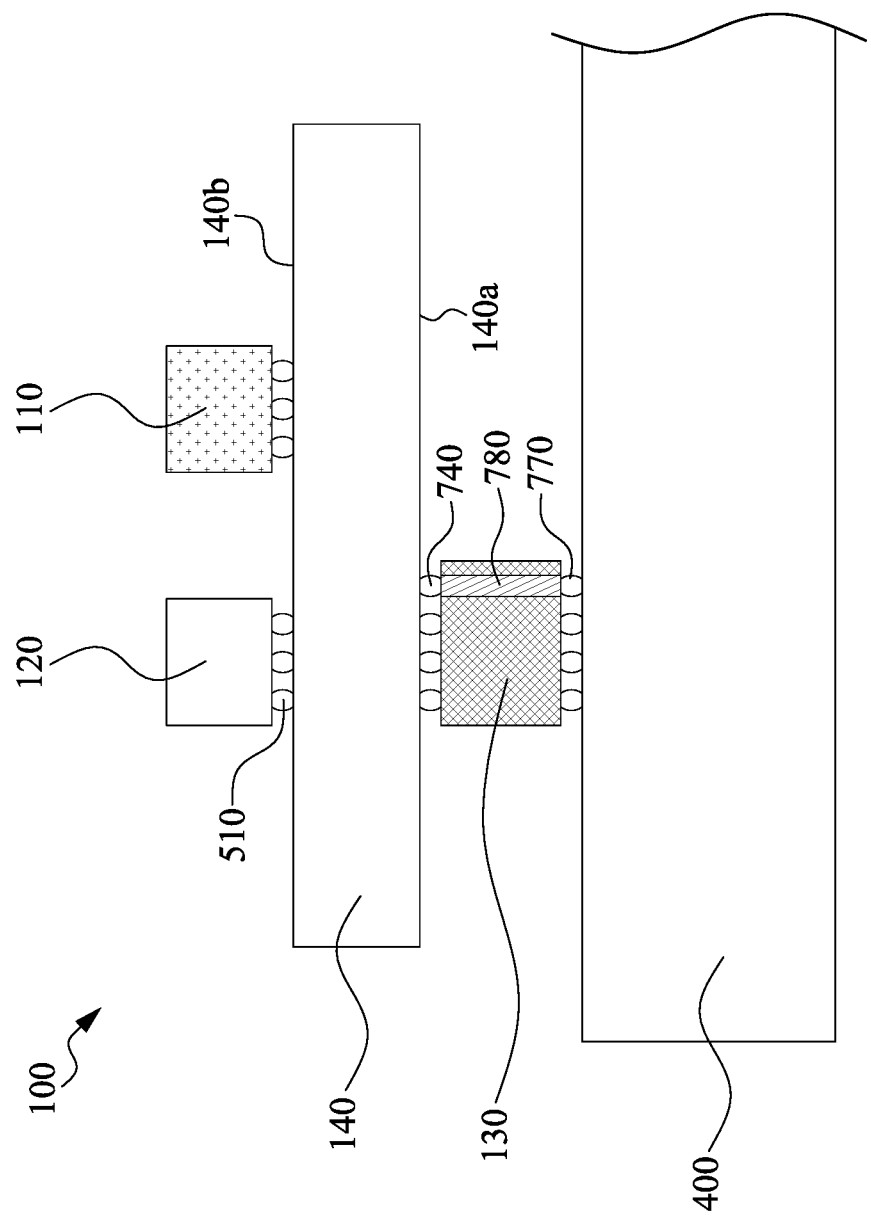
FIG. 7C illustrates a cross-sectional view of a portion of a semiconductor package in accordance with some arrangements of the present disclosure.

FIG. 7C illustrates a cross-sectional view of a portion of a semiconductor package in accordance with some arrangements of the present disclosure. In some arrangements, FIG. 7C shows a structure including the package 100.

In some arrangements, the package 100 further includes one or more conductive bumps 740, one or more conductive bumps 770, and a conductive through via 780 (also referred to as a TSV).

In some arrangements, the conductive through via 780 passes through the connection element 130. In some arrangements, the substrate 140 is electrically connected to the base layer 400 through the conductive through via 780. In some arrangements, the connection element 130 (or the I/O element) has a relatively large size compared to that of the processing element 110 or that of the storage element 120. Thus a TSV may be formed within the connection element 130, allowing shortening of the current path and thus improving the electrical performance.

Figure 7D:
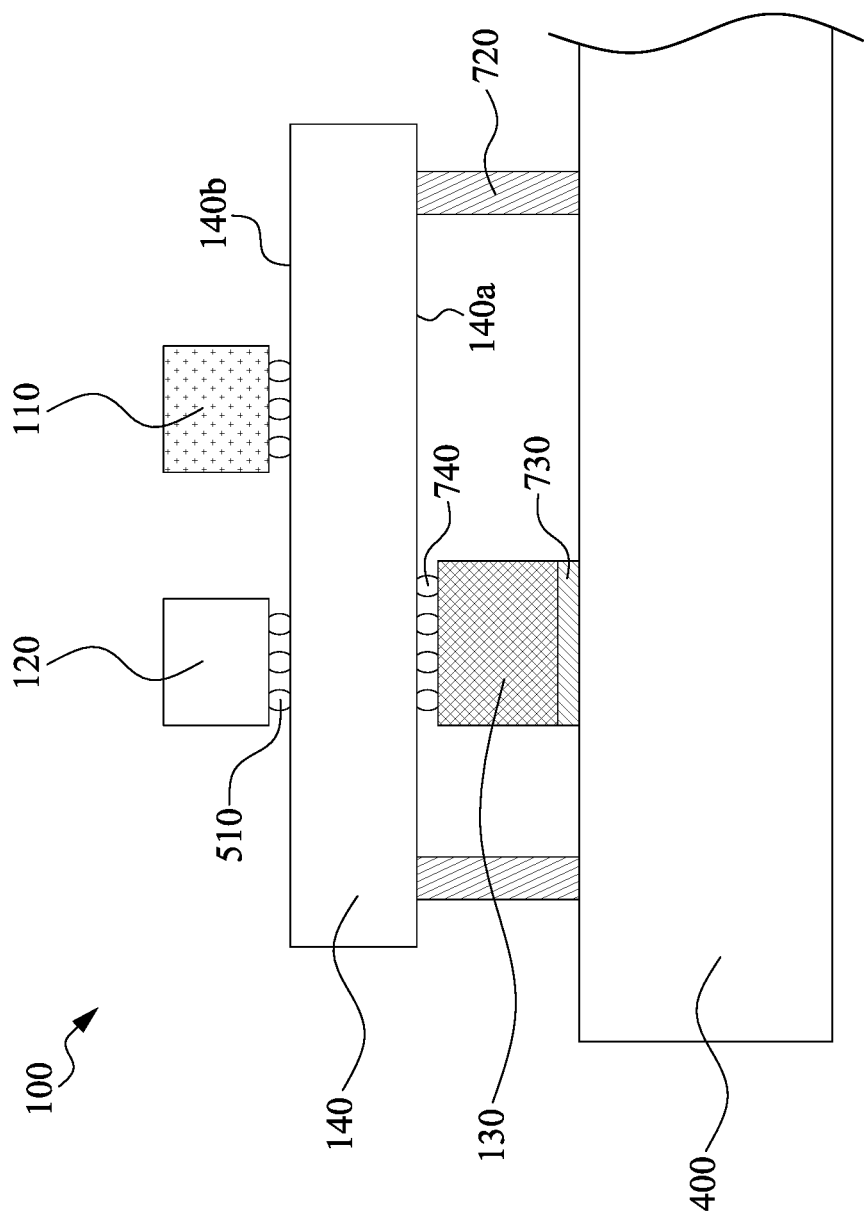
FIG. 7D illustrates a cross-sectional view of a portion of a semiconductor package in accordance with some arrangements of the present disclosure.

FIG. 7D illustrates a cross-sectional view of a portion of a semiconductor package in accordance with some arrangements of the present disclosure. In some arrangements, FIG. 7D shows a structure including the package 100.

In some arrangements, the substrate 140 is electrically connected to the base layer 400 through at least one conductive structure 720. In some arrangements, the connection element 130 is electrically connected to the base layer 400 through the substrate 140 and the conductive structure 720. In some arrangements, the conductive structure 720 includes a conductive pillar. In some arrangements, the connection element 130 is adhered to the base layer 400 through the adhesion layer 730 (e.g., a DAF), and the connection element 130 is electrically connected to the substrate 140 through the conductive bumps 740.

In some arrangements, the semiconductor packages 6A-6B can be implemented with any of the package structures shown in FIG. 7A through FIG. 7D, in place of, or in addition to, the package 100 and/or the package 200 illustrated in FIGS. 6A-6B.

Figure 8:
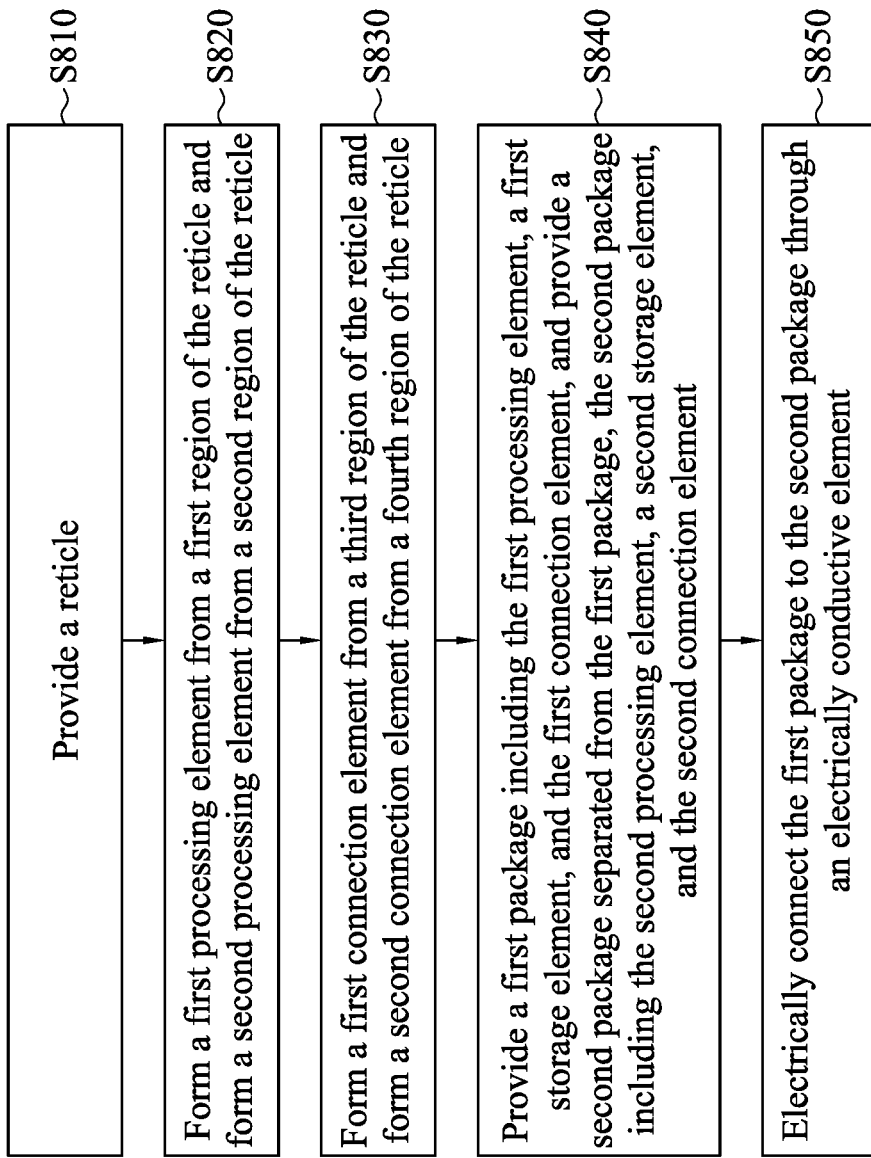
FIG. 8 illustrates a flow chart showing various operations in a method of manufacturing a semiconductor package in accordance with some arrangements of the present disclosure.

FIG. 8 illustrates a flow chart showing various operations in a method of manufacturing a semiconductor package in accordance with some arrangements of the present disclosure.

In the operation S810, a reticle including a plurality of regions is provided. In other arrangements, a monolithic processing unit is provided. In some arrangements, the monolithic processing unit may include a plurality of chiplets, such as processing elements 110 and 210 and connection elements 130 and 230. In some arrangements, the monolithic processing unit including the plurality of chiplets may be designed to provide a fully functionality of an independent semiconductor chip (e.g., an ASIC chip).

In the operation S820, a processing element 110 (or a processing chiplet) is formed by a first region of the reticle, and a processing element 210 (or a processing chiplet) is formed by a second region of the reticle. In some other arrangements, the monolithic processing unit is divided into separated processing elements 110 and 210 (or separated processing chiplets). In some arrangements, the monolithic processing unit is a multi-chiplet semiconductor chip, and the multi-chiplet semiconductor chip is diced and sorted into a plurality of chiplets, such as the processing elements 110 and 210.

In the operation S830, a connection element 130 is formed by a third region of the reticle, and a connection element 230 is formed by a fourth region of the reticle. In some other arrangements, connection elements 130 and 230 are separated from the monolithic processing unit. In some arrangements, the monolithic processing unit is a multi-chiplet semiconductor chip, and the multi-chiplet semiconductor chip is diced and sorted into a plurality of chiplets, such as the processing elements 110 and 210 and the connection elements 130 and 230. In some arrangements, the operations S820 and S830 may be performed simultaneously.

In the operation S840, a package 100 including a processing element 110, one or more storage elements 120, and one or more connection elements 130 is provided, and a package 200 including a processing element 210, one or more storage elements 220, and one or more connection elements 230 is provided, the package 200 being separated from the package 100.

In the operation S850, the package 100 is electrically connected to the package 200 through an electrically conductive element (e.g., one or more of the electrically conductive elements 330A, 330B, 330C, and 340).

In some arrangements, the aforesaid operations S810 through S850 can be implemented on any of the semiconductor packages 1, 2, 3, 4A-4D and 6A-6B.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some arrangements, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific arrangements thereof, these descriptions and illustrations do not limit the present disclosure. It can be clearly understood by those skilled in the art that various changes may be made, and equivalent components may be substituted within the arrangements without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other arrangements of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package, comprising:
   a first processing element over a substrate;
   a first input/output (I/O) element over the substrate and electrically connected to the first processing element;
   a second processing element over the substrate; and
   a second I/O element over the substrate and electrically connected to the second processing element, wherein a gate length of the first I/O element is different from a gate length of the second I/O element,
   wherein a gate length of the first processing element is less than the gate length of the first I/O element.

2. The semiconductor package as claimed in claim 1, wherein one of the first I/O element and the second I/O element comprises a FinFET.

3. The semiconductor package as claimed in claim 1, further comprising a storage element on the substrate, wherein a gate length of the first processing element is less than a gate length of the storage element.

4. The semiconductor package as claimed in claim 1, further comprising a storage element disposed over the first processing element.

5. The semiconductor package as claimed in claim 4, wherein the first processing element comprises a conductive through via, and the storage element connects to the first processing element through the conductive through via.

6. The semiconductor package as claimed in claim 5, wherein the conductive through via comprises a through silicon via (TSV).

7. The semiconductor package as claimed in claim 1, wherein the first I/O element and the first processing element partially overlap in a vertical direction.

8. The semiconductor package as claimed in claim 1, wherein the second I/O element and the second processing element partially overlap in a vertical direction.

9. A semiconductor package, comprising:
   a first processing element over a substrate;
   a first I/O element over the substrate and electrically connected to the first processing element;
   a second processing element over the substrate, wherein a gate length of the first processing element is different from a gate length of the second processing element; and
   an electrically conductive element over the substrate, wherein the electrically conductive element is disposed between the first processing element and the second processing element, and the electrically conductive element electrically connects the first processing element with the second processing element,
   wherein the electrically conductive element comprises an active component.

10. The semiconductor package as claimed in claim 9, wherein the first I/O element is at a peripheral region of the first processing element.

11. The semiconductor package as claimed in claim 9, wherein the first processing element is electrically connected to the second processing element through the first I/O element.

12. The semiconductor package as claimed in claim 9, wherein the first processing element and the second processing element are configured to perform different processing functions.

13. The semiconductor package as claimed in claim 12, wherein one of the first processing element and the second processing element is configured to perform data processing, and the other one of the first processing element and the second processing element is configured to perform image processing.

14. A semiconductor package, comprising:
a first processing element over a substrate;
a first I/O element over the substrate and electrically connected to the first processing element;
a second processing element over the substrate and electrically connected to the first processing element, wherein a gate length of the first processing element is different from a gate length of the first I/O element; and
at least two storage elements over the substrate and electrically connected to the first processing element or the second processing element.

15. The semiconductor package as claimed in claim 14, wherein the gate length of the first processing element is different from a gate length of the second processing element.

16. The semiconductor package as claimed in claim 14, further comprising a second I/O element over the substrate and electrically connected to the second processing element, wherein the gate length of the first I/O element is different a gate length of the second I/O element.

* * * * *